(12) United States Patent
Machida

(10) Patent No.: US 11,730,057 B2
(45) Date of Patent: Aug. 15, 2023

(54) ELECTRONIC DEVICE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/467,822

(22) Filed: Sep. 7, 2021

(65) Prior Publication Data

US 2022/0077374 A1     Mar. 10, 2022

(30) Foreign Application Priority Data

Sep. 7, 2020   (JP) .................. 2020-150032

(51) Int. Cl.
  *H10N 10/17* (2023.01)
  *F24S 10/30* (2018.01)

(52) U.S. Cl.
  CPC .............. *H10N 10/17* (2023.02); *F24S 10/30* (2018.05)

(58) Field of Classification Search
  CPC ..... H01L 31/0525; H01L 35/32; H10N 10/17; F24S 10/30
  See application file for complete search history.

(56) References Cited

U.S. PATENT DOCUMENTS

2007/0144574 A1   6/2007  Yada
2015/0280099 A1*  10/2015 Boukai .................. H01L 35/32
                                                      438/54

FOREIGN PATENT DOCUMENTS

| EP | 3 460 375   | 3/2019  |
| EP | 3 524 912   | 8/2019  |
| EP | 3 628 956   | 4/2020  |
| GN | 108667347   | 6/2020  |
| JP | 2011-115036 | 6/2011  |
| TW | 201037244   | 10/2010 |

OTHER PUBLICATIONS

Machine translation—TW201037244 (Year: 2010).*
Machine translation of JP 2011115036A (Year: 2011).*
European Search Report dated Jan. 21, 2022, 9 pages.

* cited by examiner

*Primary Examiner* — Tamir Ayad
(74) *Attorney, Agent, or Firm* — Rankin, Hill & Clark LLP

(57) ABSTRACT

An electronic device includes a light-receiving device configured to receive solar light, a loop-type heat pipe to which heat is input from the light-receiving device and in which an operating fluid is enclosed in a loop-shaped flow path, and a thermoelectric conversion element configured to convert a temperature difference of the loop-type heat pipe into electric power.

8 Claims, 19 Drawing Sheets

ELECTRONIC DEVICE

CROSS-REFERENCE TO RELATED APPLICATIONS

This application is based upon and claims the benefit of priority from prior Japanese patent application No. 2020-150032 filed on Sep. 7, 2020, the entire contents of which are incorporated herein by reference.

TECHNICAL FIELD

The present invention relates to an electronic device.

BACKGROUND ART

In the related art, known is an electronic device configured to generate electric power by using heat of a heat generation source (for example, refer to Patent Literature 1). In this kind of the electronic device, heat of the heat generation source is moved to one surface of a thermoelectric conversion element by a loop-type heat pipe where an operating fluid is enclosed in a loop-shaped flow path. Thereby, a temperature of one surface of the thermoelectric conversion element is raised and the operating fluid is lowered to a low-temperature state and is then moved to the other surface of the thermoelectric conversion element to cool the other surface of the thermoelectric conversion element. Thereby, by using a temperature difference between one surface and the other surface of the thermoelectric conversion element, electric power can be generated by the thermoelectric conversion element.

CITATION LIST

Patent Literature

Patent Literature 1: JP-A-2011-115036

SUMMARY OF INVENTION

According to the electronic device of the related art, a heat-generating component such as a CPU is used as the heat generation source, and an external power supply for driving the heat-generating component is required. For this reason, the electronic device cannot be used at a place where the external power supply cannot be secured. That is, there is a restriction on a place where the electronic device can be used.

Aspect of non-limiting embodiments of the present disclosure is to increase places where the electronic device can be used.

An electronic device according to the non-limiting embodiment of the present disclosure comprises:
  a light-receiving device configured to receive solar light;
  a loop-type heat pipe to which heat is input from the light-receiving device and in which an operating fluid is enclosed in a loop-shaped flow path; and
  a thermoelectric conversion element configured to convert a temperature difference of the loop-type heat pipe into electric power.

According to one aspect of the present invention, it is possible to increase places where the electronic device can be used.

DESCRIPTION OF EMBODIMENTS

Hereinafter, one embodiment will be described with reference to the accompanying drawings.

Note that, for convenience sake, in the accompanying drawings, a characteristic part is enlarged so as to easily understand the feature, and the dimension ratios of the respective constitutional elements may be different in the respective drawings. Also, in the sectional views, hatching of some members is omitted so as to easily understand a sectional structure of each member. In the respective drawings, the X-axis, the Y-axis and the Z-axis orthogonal to each other are shown. In descriptions below, for convenience sake, a direction extending along the X-axis is referred to as 'X-axis direction', a direction extending along the Y-axis is referred to as 'Y-axis direction', and a direction extending along the Z-axis is referred to as 'Z-axis direction'. Note that, in the present specification, the description 'as seen from above' means seeing a target object in the Z-axis direction, and 'planar shape' means a shape as seen in the Z-axis direction.

(Overall Configuration of Electronic Device 10)

Figure 1:
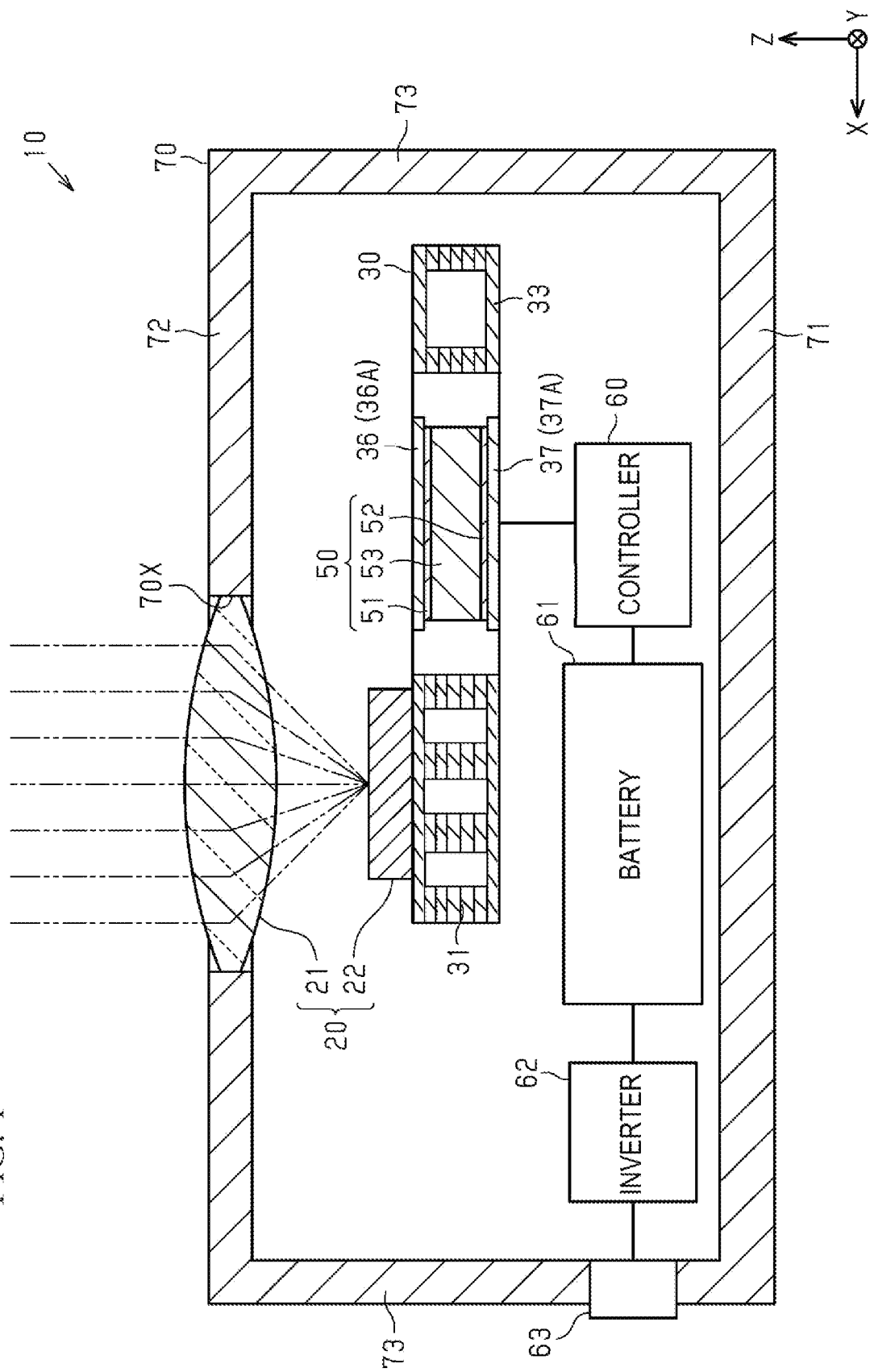
FIG. 1 is a schematic configuration view showing an electronic device according to one embodiment.

As shown in FIG. 1, the electronic device 10 includes a light-receiving device 20 configured to receive solar light, a loop-type heat pipe 30 to which heat is input from the light-receiving device 20, and a thermoelectric conversion element 50 configured to convert a temperature difference between a high-temperature part and a low-temperature part of the loop type heat pipe 30 into electric power. The light-receiving device 20 includes, for example, a collecting lens 21 configured to collect the solar light, and a heat storage material 22 configured to receive the solar light via the collecting lens 21. The electronic device 10 includes, for example, a controller 60 connected to the thermoelectric conversion element 50, a battery 61 connected to the controller 60, an inverter 62 connected to the battery 61, and an external port 63 connected to the inverter 62. The electronic device 10 includes, for example, a case 70 configured to accommodate the heat storage material 22, the loop-type heat pipe 30, the thermoelectric conversion element 50, the controller 60, the battery 61 and the inverter 62.

Here, the thermoelectric conversion element 50 is a thermoelectric conversion element using a Seebeck effect, for example. In the thermoelectric conversion element 50, when there is a temperature difference between one surface and the other surface of the thermoelectric conversion element 50, a potential difference (electromotive force) occurs between the one surface and the other surface.

The thermoelectric conversion element 50 includes, for example, a substrate 51, a substrate 52 facing the substrate 51 in the Z-axis direction, and a plurality of thermoelectric elements 53 arranged between the substrate 51 and the substrate 52. As used herein, 'facing' indicates that surfaces or members are in front of each other, and includes not only a case where they are completely in front of each other, but also a case where they are partially in front of each other. Also, as used herein, 'facing' includes both a case where a member different from two parts is interposed between the two parts and a case where no member is interposed between the two parts.

The substrate 51 has a flat plate shape, for example. The substrate 51 has a rectangular flat plate shape parallel to the XY plane, for example. The substrate 51 is provided on an upper side of the thermoelectric conversion element 50 in the Z-axis direction, for example. An upper surface (first surface) of the substrate 51 is connected to the high-temperature part of the loop-type heat pipe 30, for example. A lower surface of the substrate 51 is provided with electrodes aligned in a predetermined pattern, for example.

The substrate 52 has a flat plate shape, for example. The substrate 52 has a rectangular flat plate shape parallel to the XY plane, for example. The substrate 52 is provided on a lower side of the thermoelectric conversion element 50 in the Z-axis direction, for example. A lower surface (second surface) of the substrate 52 is connected to the low-temperature part of the loop-type heat pipe 30, for example. An upper surface of the substrate 52 is provided with electrodes aligned in a predetermined pattern, for example.

The substrates 51 and 52 may be ceramic substrates or resin substrates. Note that, the higher the thermal conductivity of the substrates 51 and 52 is, the electric power generation efficiency of the thermoelectric conversion element 50 is further improved. Therefore, the substrates 51 and 52 are preferably formed of a material of high thermal conductivity. In the present embodiment, the substrates 51 and 52 are formed of aluminum nitride.

The plurality of thermoelectric elements 53 includes, for example, a plurality of pairs of P-type thermoelectric element and an N-type thermoelectric element, and is sandwiched between the lower surface of the substrate 51 and the upper surface of the substrate 52 in the Z-axis direction. Each thermoelectric element 53 is formed of a thermoelectric conversion material. As the thermoelectric conversion material, for example, bismuth/tellurium-based compounds, iron/silicide-based compounds, skutterudite compounds and the like may be used.

The plurality of thermoelectric elements 53 is arranged such that P-type thermoelectric elements and N-type thermoelectric elements are alternately aligned side by side in both the X-axis direction and the Y-axis direction. The P-type thermoelectric element and the N-type thermoelectric element adjacent to each other and constituting a pair are connected to each other by the electrode formed on the lower surface of the substrate 51 or the electrode formed on the upper surface of the substrate 52. In the thermoelectric conversion element 50, for example, all of the P-type thermoelectric elements and the N-type thermoelectric elements are connected in series via the electrodes formed on the substrates 51 and 52.

Each thermoelectric element 53 is configured to generate electric power corresponding to the temperature difference between the substrate 51 and the substrate 52. Here, in the thermoelectric conversion element 50, all the thermoelectric elements 58 are connected in series. Therefore, the summed electric power of the electric powers generated in all the thermoelectric elements 53 becomes a total generated electric power output of the thermoelectric conversion element 50.

(Configuration of Case 70)

The case 70 has a box shape. The case 70 has, for example, a bottom wall part 71, an upper wall part 72 facing the bottom wall part 71 in the Z-axis direction, and a plurality of (here, four) sidewall parts 73 provided between the bottom wall part 71 and the upper wall part 72. The case 70 has, for example, a structure closed by the bottom wall part 71, the upper wall part 72 and the plurality of sidewall parts 73.

Figure 2:
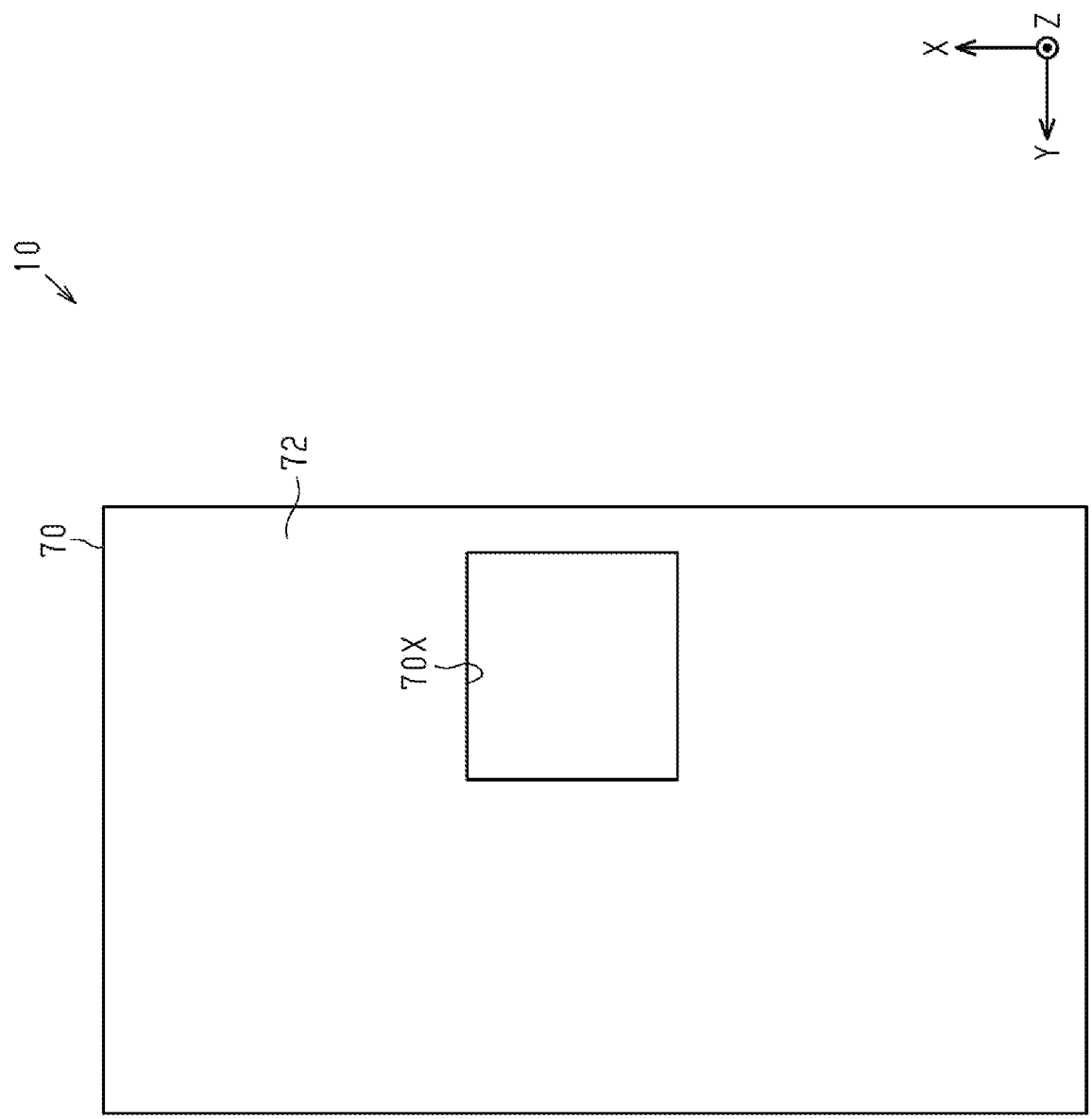
FIG. 2 is a schematic plan view showing the electronic device according to one embodiment.

As shown in FIGS. 1 and 2, the upper wall part 72 is provided with a lighting window 70X for introducing solar light. The lighting window 70X is provided at a part of the upper wall part 72, for example. The lighting window 70X is provided at a central part of the upper wall part 72 in the X-axis direction, for example. As shown in FIG. 1, the lighting window 70X is formed to penetrate through the upper wall part 72 in a thickness direction (here, the Z-axis direction).

(Configuration of Collecting Lens 21)

The collecting lens 21 is attached to the case 70. The collecting lens 21 is maintained, for example, at the upper wall part 72 of the case 70. The collecting lens 21 is attached, for example, to an inside of the lighting window 70X. The collecting lens 21 is, for example, a convex lens. The collecting lens 21 is provided such that an optic axis thereof faces toward a direction parallel to the Z-axis direction, for example. The collecting lens 21 is provided in a position in which it overlaps the heat storage material 22 in the Z-axis direction. The collecting lens 21 is provided above the heat storage material 22 in the Z-axis direction. The collecting lens 21 is formed to have an area greater than the heat storage material 22 in the XY plane, for example.

The collecting lens 21 is configured so that the solar light (refer to the dashed-two-dotted line) transmitting toward the lower in the Z-axis direction is collected to the heat storage material 22. For this reason, the solar light incident on the heat storage material 22 has a higher luminous flux density, i.e., a higher light energy per unit area than the solar light outside the case 70.

Here, the electronic device 10 is equipped at a place where an upper surface of the upper wall part 72 can be irradiated with the solar light, for example. However, in the electronic device 10, the solar light penetrates through the collecting lens 21 and enters an internal space of the case 70. At this time, in the electronic device 10, the light energy of the solar light incident on the collecting lens 21 is condensed by the collecting lens 21, and the condensed light energy is transferred to the heat storage material 22.

(Configuration of Heat Storage Material 22)

The heat storage material 22 is configured to receive the solar light collected by the collecting lens 21, for example. The heat storage material 22 is heated by the solar light irradiated via the collecting lens 21 and stores the heat, for example. For example, the heat storage material 22 absorbs the light energy of the solar light, as heat energy. The heat storage material 22 is configured to input the heat to the loop-type heat pipe 30. For example, the heat storage material 22 transfers the stored heat energy to the loop-type heat pipe 30. Examples of the material of the heat storage material 22 may include materials having a large heat capacity such as paraffin, silicon rubber, a low-melting point metal compound, and the like.

The heat storage material 22 has a columnar or prismatic shape, for example. The heat storage material 22 has a cuboid shape, for example. The heat storage material 22 has an upper surface, on which the solar light is incident, a lower surface on an opposite side to the upper surface in the Z-axis direction, and a plurality of (here, four) side surfaces provided between the upper surface and the lower surface. The heat storage material 22 is fixed in close contact with the loop-type heat pipe 30, for example. For example, the lower surface of the heat storage material 22 is in close contact with the upper surface of the loop-type heat pipe 30.

The heat storage material 22 is entirely heated by the solar light incident on the upper surface thereof, and transfers the heat to an evaporator 31 from the entire lower surface thereof. Thereby, since the heat based on the solar light collected by the collecting lens 21 can be transferred to the evaporator 31 on a surface, the heat can be stably input from the heat storage material 22 to the evaporator 31. Note that, a thermal conductive member (TIM. Thermal Interface Material) may be interposed between the lower surface of the heat storage material 22 and the upper surface of the evaporator 31. The thermal conductive member reduces a contact thermal resistance between the heat storage material 22 and the evaporator 31, and enables smooth thermal conduction from the heat storage material 22 to the evaporator 31.

(Configuration of Loop-Type Heat Pipe 30)

Figure 3:
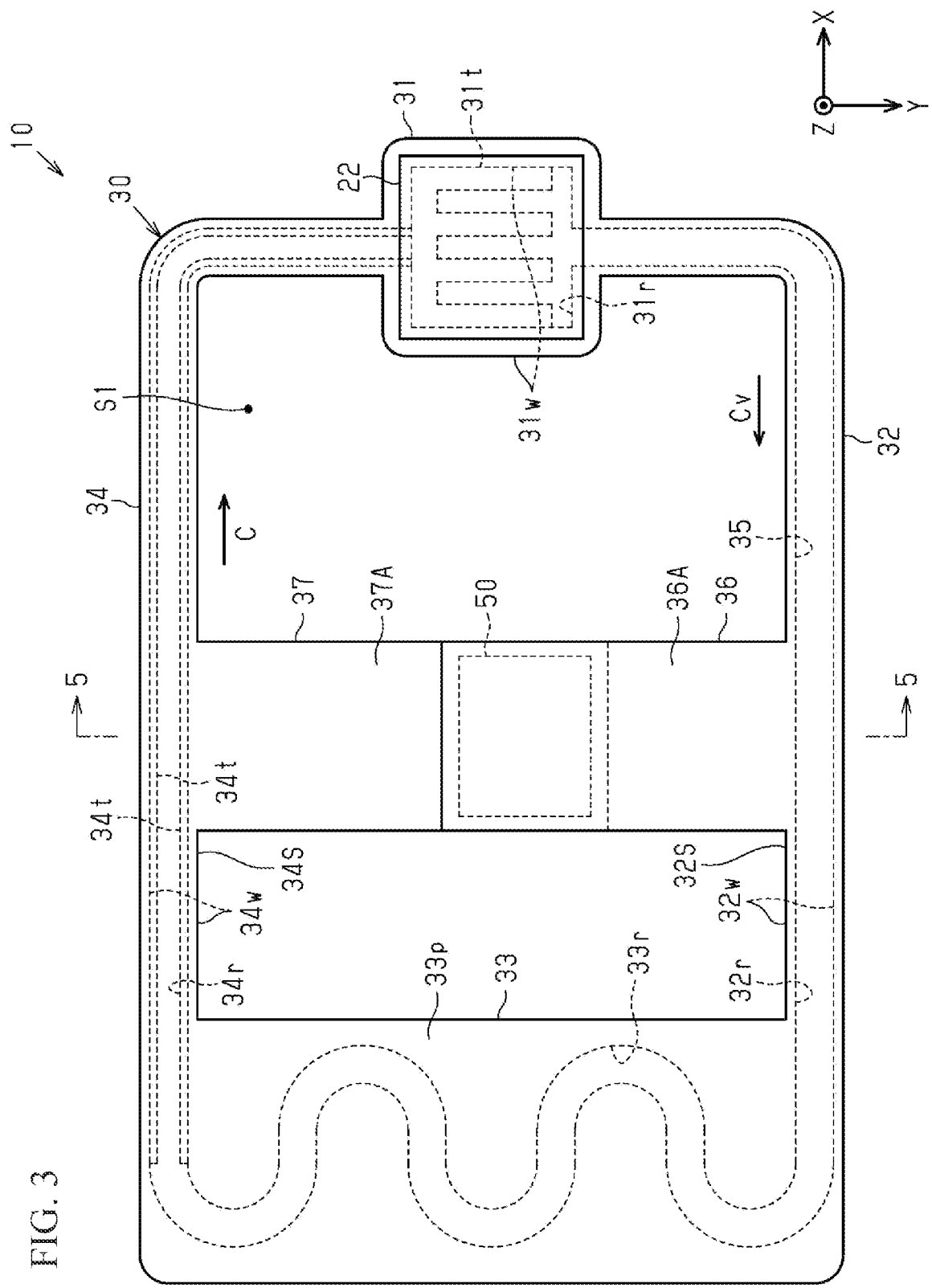
FIG. 3 is a schematic plan view showing the electronic device according to one embodiment.
Figure 4:
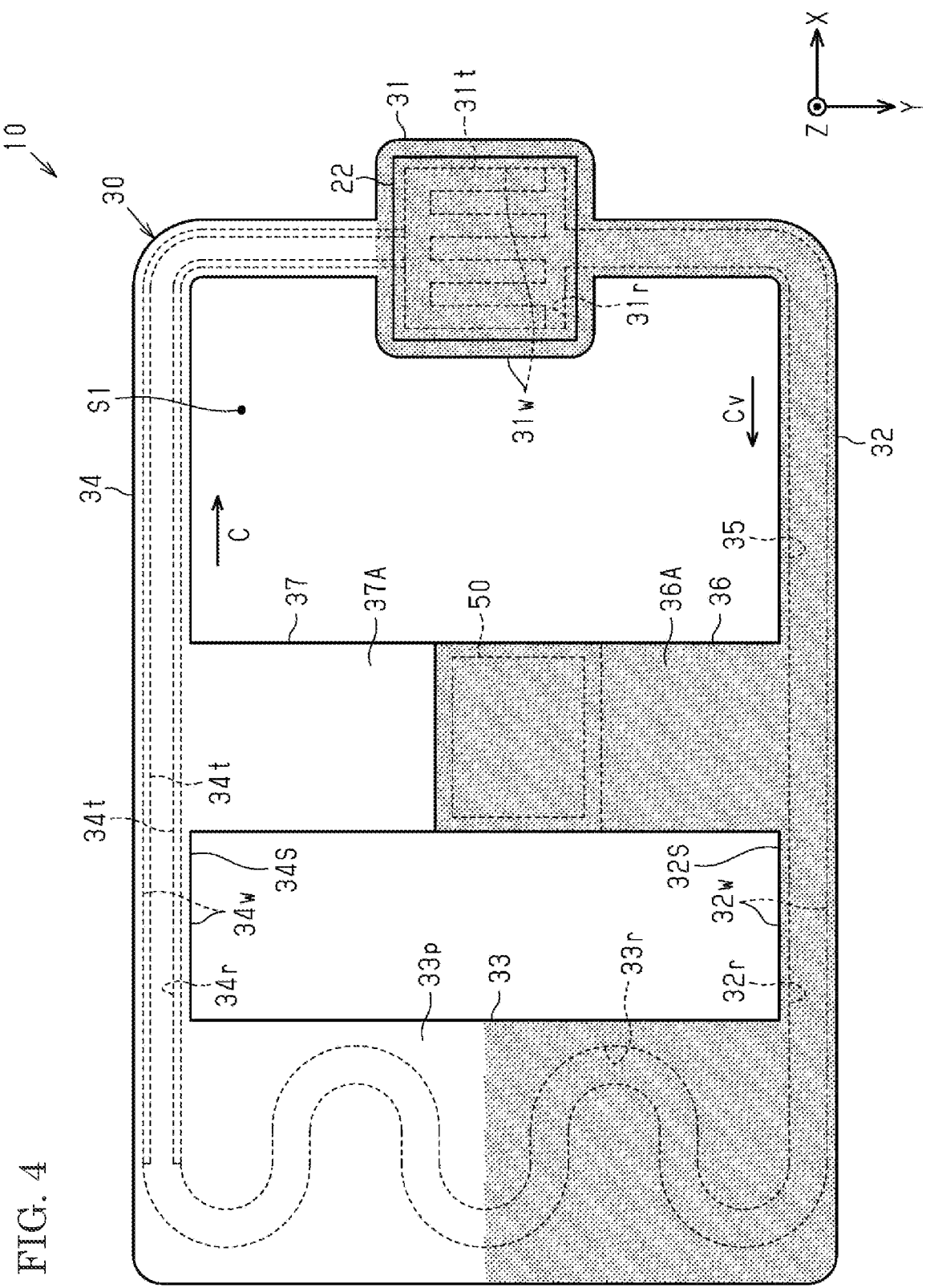
FIG. 4 is a schematic plan view showing the electronic device according to one embodiment.

As shown in FIGS. 3 and 4, the loop-type heat pipe 30 has an evaporator 31, a vapor pipe 32, a condenser 33 and a liquid pipe 34. The evaporator 31 and the condenser 33 are connected by the vapor pipe 32 and the liquid pipe 34. The evaporator 31 has a function of vaporizing an operating fluid C by the heat input from the heat storage material 22 to generate vapor Cv. The vapor Cv generated in the evaporator 31 is sent to the condenser 33 via the vapor pipe 32. The condenser 33 has a function of condensing the vapor Cv of the operating fluid C. The condensed operating fluid C is sent to the evaporator 31 via the liquid pipe 34. The vapor pipe 32 and the liquid pipe 34 form a loop-shaped flow path 35 through which the operating fluid C or the vapor Cv flows. In the loop-type heat pipe 30, the high-temperature heat moves from the evaporator 31 configured to vaporize the operating fluid C by the heat based on the solar light to the vapor pipe 32, and the operating fluid C whose temperature has been lowered by the condenser 33 configured to radiate the heat flows to the evaporator 31 through the liquid pipe 34. Thereby, as shown in FIG. 4, the evaporator 31, the vapor pipe and a part of the condenser 33 on the vapor pipe 32-side become a high-temperature part (refer to a satin pattern in FIG. 4), and the liquid pipe 34 becomes a low-temperature part whose temperature is lower than the high-temperature part. For this reason, in the loop-type heat pipe 30, a temperature difference occurs between the evaporator 31, vapor pipe 32 and condenser 33 and the liquid pipe 34.

Here, as the operating fluid C, a fluid having a high vapor pressure and a high latent heat of vaporization is preferably used. By using such operating fluid C, it is possible to effectively cool the heat-generating component by the latent heat of vaporization. As the operating fluid C, ammonia, water, freon, alcohol, acetone and the like can be used.

As shown in FIG. 3, the vapor pipe 32 is formed, for example, by an elongated pipe body. The liquid pipe 34 is formed, for example, by an elongated pipe body. In the present embodiment, the vapor pipe 32 and the liquid pipe 34 are the same in size (i.e., length) in a length direction, for example. Note that, the length of the vapor pipe 32 and the length of the liquid pipe 34 may be different from each other. For example, the length of the vapor pipe 32 may be shorter than the length of the liquid pipe 34. Here, in the present specification, the 'length direction' of the evaporator 31, the vapor pipe 32, the condenser 33 and the liquid pipe 34 is a direction that coincides with a direction (refer to an arrow in FIG. 3) in which the operating fluid C or vapor Cv flows in each member.

The evaporator 31 has a pair of pipe walls 31w provided on both sides in a width direction orthogonal to the length direction of the evaporator 31, as seen from above, and a flow path 31r provided between the pair of pipe walls 31w, for example. The flow path 31r is a part of the loop-shaped flow path 35. The heat storage material 22 is fixed in close contact with an upper surface of the evaporator 31, for example. A planar shape of the evaporator 31 is formed to be one size larger than a planar shape of the heat storage material 22, for example. Here, the heat storage material 22 is provided to overlap the flow path 31r, as seen from above. For example, the heat storage material 22 is provided to overlap the entire flow path 31r, as seen from above.

The evaporator 31 is provided with a porous body 31t, for example. The porous body 31t has a comb-teeth shape, for example. In the evaporator 31, a region in which the porous body 31t is not provided is formed as a space. Note that, the number of comb-teeth of the porous body 31t can be determined as appropriate.

The vapor pipe 32 has a pair of pipe walls 32w provided on both sides in the width direction orthogonal to the length direction of the evaporator 32, as seen from above, and a flow path 32r provided between the pair of pipe walls 32w, for example. The flow path 32r is formed to communicate with the flow path 31r of the evaporator 31. The flow path 32r is a part of the loop-shaped flow path 35. The vapor Cv generated in the evaporator 31 is guided to the condenser 33 via the vapor pipe 32.

The condenser 33 has a heat radiation plate 33p whose area is increased for heat radiation, and a serpentine flow path 33r in the heat radiation plate 33p, for example. The flow path 33r is formed to communicate with the flow path 32r of the vapor pipe 32. The flow path 33r is a part of the loop-shaped flow path 35. The vapor Cv guided via the vapor pipe 32 is condensed in the condenser 33.

The liquid pipe 34 has a pair of pipe walls 34w provided on both sides in the width direction orthogonal to the length direction of the liquid pipe 34, as seen from above, and a flow path 34r provided between the pair of pipe walls 34w, for example. The flow path 34r is formed to communicate with the flow path 33r of the condenser 33 and the flow path 31r of the evaporator 31. The flow path 34r is a part of the loop-shaped flow path 35. The operating fluid C condensed in the condenser 33 is guided to the evaporator 31 through the liquid pipe 34.

The liquid pipe 34 is provided with porous bodies 34t, for example. The porous bodies 34t extend from the condenser 33 to the evaporator 31 along the length direction of the liquid pipe 34, for example. The porous bodies 34t are configured to guide the operating fluid C condensed in the condenser 33 to the evaporator 31 by a capillary force generated in the porous bodies 34t.

In this way, the evaporator 31, the vapor pipe 32, the condenser 33 and the liquid pipe 34 are formed as a loop-shaped structure. For example, the evaporator 31, the vapor pipe 32, the condenser 33 and the liquid pipe 34 are formed as a loop-shaped structure as a whole, as seen from above. Specifically, the loop-type heat pipe 30 has a loop structure, and has an internal space S1 surrounded by the evaporator 31, the vapor pipe 32, the condenser 33 and the liquid pipe 34. The internal space S1 is formed to penetrate through the loop-type heat pipe 30 in the Z-axis direction, for example. The evaporator 31, the vapor pipe 32, the condenser 33 and the liquid pipe 34 are formed on the same XY plane, for example.

The loop-type heat pipe 30 has a temperature-raising part 36 configured to raise a temperature of one surface of the thermoelectric conversion element 50, and a cooling part 37 configured to cool the other surface of the thermoelectric conversion element 50, for example.

The temperature-raising part 36 is provided at the high-temperature part of the loop-type heat pipe 30. The temperature-raising part 36 is provided to the vapor pipe 32, for example. The temperature-raising part 36 is constituted by a high temperature-side extension part 36A extending from the vapor pipe 32 to the internal space S1 of the loop structure, for example. The high temperature-side extension part 36A is formed to extend from one pipe wall 32w of the vapor pipe 32 toward the liquid pipe 34, for example. The high temperature-side extension part 36A is formed to extend from one pipe wall 32w of the vapor pipe 32 toward a center of the internal space S1 in the Y-axis direction, for example. The high temperature-side extension part 36A is in contact with the upper surface of the substrate 51 (refer to FIG. 1) of the thermoelectric conversion element 50, for example.

The cooling part 37 is provided at the low-temperature part of the loop-type heat pipe 30. The cooling part 37 is provided to the liquid pipe 34, for example. The cooling part 37 is constituted by a low temperature-side extension part 37A extending from the liquid pipe 34 to the internal space S1 of the loop structure, for example. The low temperature-side extension part 37A is formed to extend from one pipe wall 34w of the liquid pipe 34 toward the vapor pipe 32, for example. The low temperature-side extension part 37A is formed to extend from one pipe wall 34w of the liquid pipe 34 toward the center of the internal space S1 in the Y-axis direction, for example. The low temperature-side extension part 37A is in contact with the lower surface of the substrate 52 (refer to FIG. 1) of the thermoelectric conversion element 50, for example.

Figure 5:
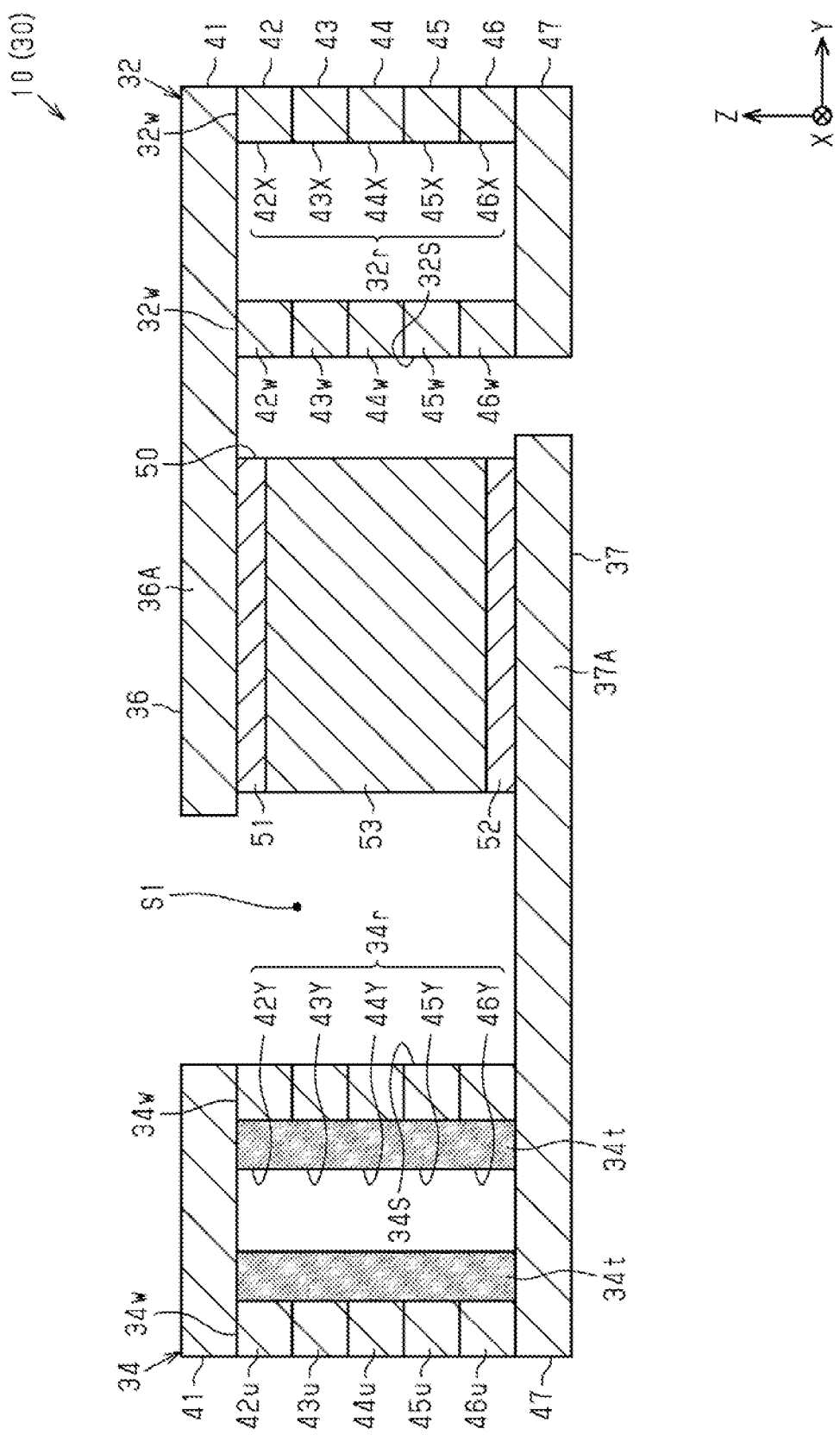
FIG. 5 is a schematic sectional view (a sectional view taken along a 5-5 line in FIG. 3) showing a loop-type heat pipe and a thermoelectric conversion element according to one embodiment.

FIG. 5 is a sectional view taken along a 5-5 line of FIG. 3 of the vapor pipe 32, the liquid pipe 34, the high temperature-side extension part 36A and the low temperature-side extension part 37A of the loop-type heat pipe 30 and the thermoelectric conversion element 50. The section is a surface orthogonal to a direction (direction denoted with an arrow in FIG. 3) in which the vapor Cv and the operating fluid C flow in the vapor pipe 32 and the liquid pipe 34.

As shown in FIG. 5, the vapor pipe 32 and the liquid pipe 34 each have a structure where 7 metal layers 41, 42, 43, 44, 45, 46 and 47 are stacked. In other words, the vapor pipe 32 and the liquid pipe 34 each have a structure where the metal layers 42 to 46, which are intermediate metal layers, are stacked between the metal layers 41 and 47, which are a pair of outer metal layers. The plurality of metal layers 41 to 47 is stacked in the Z-axis direction, for example. Each of the metal layers 41 to 47 is a copper (Cu) layer having excellent thermal conductivity. The plurality of metal layers 41 to 47 is directly bonded to each other by solid-phase bonding such as diffusion bonding, pressure welding, friction pressure welding and the like. Note that, in FIG. 5, the metal layers 41 to 47 are identified by solid lines for easy understanding. For example, when the metal layers 41 to 47 are integrated by diffusion bonding, interfaces of the respective metal layers 41 to 47 may be lost and boundaries may not be clear, in some cases. As used herein, the solid-phase bonding is a method of heating and softening bonding targets in a solid-phase (solid) state without melting the same, and then further heating, plastically deforming and bonding the bonding targets. Note that, the metal layers 41 to 47 are not limited to the copper layers and may also be formed of stainless steel, aluminum, magnesium alloy or the like. In addition, for some of the stacked metal layers 41 to 47, a material different from the other metal layers may also be used. A thickness of each of the metal layers 41 to 47 may be set to about 50 μm to 200 μm, for example. Note that, some of the stacked metal layers 41 to 47 may be formed to have a thickness different from the other metal layers, and all the metal layers may be formed to have thicknesses different from each other.

(Configuration of Vapor pipe 32)

In the present embodiment, the vapor pipe 32 is constituted by the stacked metal layers 41 to 47, and has the pipe walls 32w and the flow path 32r. Note that, in the present embodiment, the metal layers 41 and 47, which are the outermost layers among the metal layers 41 to 47, are not formed with holes or grooves. The metal layers 41 and 47 function as wall parts (a ceiling part and a bottom part) of the vapor pipe 32.

The metal layer 42 has a pair of wall parts 42w provided on both ends in the width direction (here, the Y-axis direction) of the vapor pipe 32 orthogonal to both the stacking direction (here, the Z-axis direction) of the metal layers 41 to 47 and the length direction (here, the X-axis direction) of the vapor pipe 32, and a through-hole 42X provided between the pair of wall parts 42w. The through-hole 42X is formed to penetrate through the metal layer 42 in a thickness direction (here, the Z-axis direction). The metal layer 43 has a pair of wall parts 43w provided on both ends in the width direction of the vapor pipe 32 and a through-hole 43X provided between the pair of wall parts 43w. The through-hole 43X is formed to penetrate through the metal layer 43 in the thickness direction. The metal layer 44 has a pair of wall parts 44w provided on both ends in the width direction of the vapor pipe 32 and a through-hole 44X provided between the pair of wall parts 44w. The through-hole 44X is formed to penetrate through the metal layer 44 in the thickness direction. The metal layer 45 has a pair of wall parts 45w provided on both ends in the width direction of the vapor pipe 32 and a through-hole 45X provided between the pair of wall parts 45w. The through-hole 45X is formed to penetrate through the metal layer 45 in the thickness direction. The metal layer 46 has a pair of wall parts 46w provided on both ends in the width direction of the vapor pipe 32 and a through-hole 46X provided between the pair of wall parts 46w. The through-hole 46X is formed to penetrate through the metal layer 46 in the thickness direction.

Subsequently, the specific structure of each pipe wall 32w is described.

Each pipe wall 32w is constituted by the wall parts 42w to 46w of the intermediate metal layers 42 to 46 among the metal layers 41 to 47. Each pipe wall 32w is constituted by the plurality of wall parts 42w to 46w sequentially stacked. In the present embodiment, the wall parts 42w to 46w are not formed with holes or grooves.

Subsequently, the specific structure of the flow path 32r is described.

The flow path 32r is constituted by the through-holes 42X to 46X of the intermediate metal layers 42 to 46 among the metal layers 41 to 47. The flow path 32r is constituted by the through-holes 42X to 46X penetrating through the metal layers 42 to 46 in the thickness direction. For example, the metal layers 42 to 46 are stacked so that the through-holes 42X to 46X overlap, as seen from above. Thereby, the through-holes 42X to 46X communicate with each other, and the flow path 32r is constituted by the through-holes 42X to 46X.

(Configuration of Liquid Pipe 34)

In the present embodiment, the liquid pipe 34 is constituted by the stacked metal layers 41 to 47, and has the pipe walls 34w, the flow path 34r and the porous bodies 34t. The metal layers 41 and 47, which are the outermost layers among the metal layers 41 to 47, function as wall parts (a ceiling part and a bottom part) of the liquid pipe 34.

The metal layer 42 has a pair of wall parts 42u provided on both ends in the width direction (here, the Y-axis direction) of the liquid pipe 34 orthogonal to both the stacking direction of the metal layers 41 to 47 and the length direction (here, the X-axis direction) of the liquid pipe 34, and a through-hole 42Y provided between the pair of wall parts 42u. The through-hole 42Y is formed to penetrate through the metal layer 42 in the thickness direction. The metal layer 43 has a pair of wall parts 43u provided on both ends in the width direction of the liquid pipe 34 and a through-hole 43Y provided between the pair of wall parts 43u. The through-hole 43Y is formed to penetrate through the metal layer 43 in the thickness direction. The metal layer 44 has a pair of wall parts 44u provided on both ends in the width direction of the liquid pipe 34 and a through-hole 44Y provided between the pair of wall parts 44u. The through-hole 44Y is formed to penetrate through the metal layer 44 in the thickness direction. The metal layer 45 has a pair of wall parts 45u provided on both ends in the width direction of the liquid pipe 34 and a through-hole 45Y provided between the pair of wall parts 45u. The through-hole 45Y is formed to penetrate through the metal layer 45 in the thickness direction. The metal layer 46 has a pair of wall parts 46u provided on both ends in the width direction of the liquid pipe 34 and a through-hole 46Y provided between the pair of wall parts 46u. The through-hole 46Y is formed to penetrate through the metal layer 46 in the thickness direction.

Subsequently, the specific structure of each pipe wall 34w is described.

Each pipe wall 34w is constituted by the wall parts 42u to 46u of the intermediate metal layers 42 to 46 among the metal layers 41 to 47. Each pipe wall 34w is constituted by the plurality of wall parts 42u to 46u sequentially stacked. The wall parts 42u to 46u may be formed with holes or grooves.

The porous bodies 34t are formed continuously and integrally with the pipe walls 34w on both ends in the width direction of the liquid pipe 34, for example. Specifically, the liquid pipe 34 has the pair of porous bodies 34t provided continuously and integrally with the pair of pipe walls 34w. Note that, the porous bodies 34t are not limited to the configuration where they are formed continuously and integrally with each of the pipe walls 34w. For example, the porous body may also be formed of metal mesh, porous sintered metal or sintered ceramic, and the like.

Subsequently, the specific structure of the flow path 34r is described.

The flow path 34r is provided at a central part of the liquid pipe 34, for example. Specifically, the flow path 34r is provided between the pair of porous bodies 34t. The flow path 34r is constituted by the through-holes 42Y to 46Y of the intermediate metal layers 42 to 46 among the metal layers 41 to 47. The flow path 34r is constituted by the through-holes 42Y to 46Y penetrating through the metal layers 42 to 46 in the thickness direction. For example, the metal layers 42 to 46 are stacked so that the through-holes 42Y to 46Y overlap, as seen from above. Thereby, the through-holes 42Y to 46Y communicate with each other, and the flow path 34r is constituted by the through-holes 42Y to 46Y. Note that, the position of the flow path 34r is not limited to the above. For example, the porous body 34t may be provided at the central part of the liquid pipe 34, and the flow paths 34r may be provided on both sides with the porous body 34t being interposed therebetween.

The evaporator 31 and the condenser 33 shown in FIG. 3 are each formed by stacking the seven metal layers 41 to 47, similar to the vapor pipe 32 and the liquid pipe 34 shown in FIG. 5. Specifically, the loop-type heat pipe 30 is constituted by stacking the 7 metal layers 41 to 47. Note that, the number of the stacked metal layers is not limited to 7 layers, and may be 6 or less layers or 8 or more layers. In addition, the porous bodies 31t provided to the evaporator 31 are not limited to the configuration where they are formed continuously and integrally with each of the pipe walls 31w, similar to the porous bodies 34t of the liquid pipe 34. For example, the porous body may also be formed of metal mesh, porous sintered metal or sintered ceramic, and the like.

(Configuration of High Temperature-Side Extension Part 36A)

As shown in FIG. 5, the high temperature-side extension part 36A is constituted, for example, by the metal layer 41 (first outer metal layer), which is the outermost layer positioned on the upper side in the Z-axis direction among the metal layers 41 to 47 constituting the vapor pipe 32. The high-temperature side extension part 36A is formed so that the metal layer 41 constituting the vapor pipe 32 extends toward the liquid pipe 34, for example. The high temperature-side extension part 36A is formed in such an aspect that the metal layer 41 extends from an outer surface 32S of the pipe wall 32w, which is positioned on a side close to the liquid pipe 34, of the pair of pipe walls 32w toward the liquid pipe 34, for example. Here, the outer surface 32S of the pipe wall 32w faces the pipe wall 34w of the liquid pipe 34 in the Y-axis direction, for example. The high temperature-side extension part 36A extends from the outer surface 32S of the pipe wall 32w toward the internal space S1 of the loop structure, for example. The high temperature-side extension part 36A extends along the Y-axis direction, for example. The high temperature-side extension part 36A is formed shorter than the low temperature-side extension part 37A in the Y-axis direction, for example. The high temperature-side extension part 36A is formed to cover the upper surface of the substrate 51 of the thermoelectric conversion element 50. The high temperature-side extension part 36A is formed to cover the entire upper surface of the substrate 51, for example. A planar shape of the high temperature-side extension part 36A is formed larger than a planar shape of the substrate 51, for example. The lower surface of the high temperature-side extension part 36A is in contact with the upper surface of the substrate 51. The high temperature-side extension part 36A is formed to transfer the heat to the upper surface of the substrate 51, for example. Here, the metal layer 41 that constitutes the high temperature-side extension part 36A is warmed to high temperatures by the operating fluid C flowing through the flow path 32r of the vapor pipe 32, specifically, the vapor Cv (refer to FIG. 3) vaporized by the evaporator 31. For this reason, the high temperature-side extension part 36A can raise the temperature of the substrate 51. Note that, a thermal conductive member may be interposed between the lower surface of the high temperature-side extension part 36A and the upper surface of the substrate 51.

(Configuration of Low Temperature-Side Extension Part 37A)

The low temperature-side extension part 37A is constituted, for example, by the metal layer 47 (second outer metal layer), which is the outer metal layer positioned on the lower side in the Z-axis direction among the metal layers 41 to 47 constituting the vapor pipe 32. Specifically, the low temperature-side extension part 37A is constituted by the metal layer 47 positioned on the opposite side to the metal layer 41, which constitutes the high temperature-side extension part 36A, in the Z-axis direction. The low temperature-side extension part 37A is formed so that the metal layer 47 constituting the liquid pipe 34 extends toward the vapor pipe 32, for example. The low temperature-side extension part 37A is formed in such an aspect that the metal layer 47 extends from an outer surface 34S of the pipe wall 34w, which is positioned on a side close to the vapor pipe 32, of the pair of pipe walls 34w toward the vapor pipe 32, for example. Here, the outer surface 34S of the pipe wall 34w faces the outer surface 32S of the pipe wall 32w in the Y-axis direction, for example. The low temperature-side extension part 37A extends from the outer surface 34S of the pipe wall 34w toward the internal space S1 of the loop structure, for example. The low temperature-side extension part 37A extends along the Y-axis direction, for example. The low temperature-side extension part 37A is formed to cover the lower surface of the substrate 52 of the thermoelectric conversion element 50. The low temperature-side extension part 37A is formed to cover the entire lower surface of the substrate 52, for example. A planar shape of the low temperature-side extension part 37A is formed larger than the planar shape of the substrate 52, for example. The upper surface of the low temperature-side extension part 37A is in contact with the lower surface of the substrate 52. The low temperature-side extension part 37A is formed to transfer the heat to the lower surface of the substrate 52, for example. Here, the temperature of the metal layer 47 that constitutes the low temperature-side extension part 37A is lower than the high temperature-side extension part 36A due to the operating fluid C flowing through the flow path 34r of the liquid pipe 34, specifically, the operating fluid C condensed (cooled) by the condenser 33. For this reason, the low temperature-side extension part 37A can cool the substrate 52. Note that, a thermal conductive member may be interposed between the upper surface of the low temperature-side extension part 37A and the lower surface of the substrate 52.

(Configuration of Thermoelectric Conversion Element 50)

The thermoelectric conversion element 50 is provided to be positioned between the high temperature-side extension part 36A and the low temperature-side extension part 37A in the Z-axis direction, for example. In other words, the high temperature-side extension part 36A and the low temperature-side extension part 37A are each arranged above and below the thermoelectric conversion element 50 in the Z-axis direction, about the thermoelectric conversion element 50. In the thermoelectric conversion element 50, the temperature of the substrate 51 is raised by the high temperature-side extension part 36A and the substrate 52 is cooled by the low temperature-side extension part 37A, so that a temperature difference occurs between the substrate 51 and the substrate 52. In the thermoelectric conversion element 50, when the temperature difference occurs between the substrate 51 and the substrate 52, a potential difference (electromotive force) occurs between the substrate 51 and the substrate 52. Specifically, the thermoelectric conversion element 50 is configured to convert the temperature difference occurring between the substrate 51 and the substrate 52 into electric power. The thermoelectric conversion element 50 is configured to output the generated electric power to the controller 60 (refer to FIG. 1).

The thermoelectric conversion element 50 is arranged inside the loop structure of the loop-type heat pipe 30. Specifically, the thermoelectric conversion element 50 is arranged in the internal space S1. The thermoelectric conversion element 50 is arranged closer to the vapor pipe 32 in the Y-axis direction of the internal space S1, for example. For example, the thermoelectric conversion element 50 is arranged so that a distance between the vapor pipe 32 and the thermoelectric conversion element 50 in the Y-axis direction is shorter than a distance between the liquid pipe 34 and the thermoelectric conversion element 50 in the Y-axis direction. For example, the thermoelectric conversion element 50 is arranged so that a length of the high temperature-side extension part 36A is shorter than a length of the low temperature-side extension part 37A in the Y-axis direction of the internal space S1. Note that, the distance between the liquid pipe 34 and the thermoelectric conversion element 50 and the distance between the vapor pipe 32 and the thermoelectric conversion element 50 are not limited thereto, and can be determined as appropriate.

The controller 60 shown in FIG. 1 is configured to control charging processing of charging the electric power supplied from the thermoelectric conversion element 50 to the battery 61. The controller 60 is configured to monitor an amount of electric power supplied from the thermoelectric conversion element 50 and an amount of accumulated electric power of the battery 61 and to execute charging control, based on the amount of electric power and the amount of accumulated electric power. Specifically, the controller 60 is configured to monitor an electric power generation state of the thermoelectric conversion element 50 and an electric power accumulation state of the battery 61 and to execute the charging control based on the electric power generation state and the electric power accumulation state. The controller 60 is constituted, for example, by a CPU (Central Processing Unit), an MPU (Micro-Processing Unit) and the like.

The battery 61 is configured to accumulate the electric power supplied from the thermoelectric conversion element 50 via the controller 60. The battery 61 is configured to accumulate DC electric power generated in the thermoelectric conversion element 50, for example. The battery 61 is configured to output the accumulated DC electric power to the inverter 62, for example. The battery 61 is a DC power supply that can be recharged, for example. As the battery 61, a secondary battery such as a lithium ion battery, a nickel hydrogen battery can be used.

The inverter 62 is configured to convert the DC electric power supplied from the battery 61 into AC electric power. The inverter 62 is configured to output the converted AC electric power to the external port 63.

To the external port 63, an external device (not shown) different from the electronic device 10 is electrically connected. When the external device is electrically connected to the external port 63, the AC electric power can be supplied to the external device. Thereby, it is possible to supply, to the external device, the electric power generated in the electronic device 10 based on the heat input by the solar light. Specifically, in the electronic device 10, the heat generated as a result of irradiation of the solar light is used as a heat source and the temperature difference occurring in the loop-type heat pipe 30 based on the heat input from the heat source is applied to the thermoelectric conversion element 50, so that electric power corresponding to the temperature difference is generated in the thermoelectric conversion element 50. The electronic device 10 can supply the AC electric power based on the electric power generated in the thermoelectric conversion element 50 to the external device. Here, in the electronic device 10, since the solar light that is natural energy is used as the heat source, an external power supply for driving the heat-generating component becoming a heat source is not required.

Subsequently, the operational effects of the present embodiment are described.

(1) The electronic device 10 includes the light-receiving device 20 configured to receive solar light, the loop-type heat pipe 30 to which heat is input from the light-receiving device 20 and in which the operating fluid is enclosed in the loop-shaped flow path 35, and the thermoelectric conversion element 50 configured to convert the temperature difference of the loop-type heat pipe 30 into electric power.

According to this configuration, since the solar light that is natural energy is used as the heat source for inputting heat to the loop-type heat pipe 30, an external power supply for driving the heat-generating component that is a heat source like the related art is not required. For this reason, in the electronic device 10, even when an external power supply cannot be secured, it is possible to input heat to the loop-type heat pipe 30 by receiving the solar light and to generate the temperature difference in the loop-type heat pipe 30. Also, in the electronic device 10, it is possible to generate the electric power corresponding to the temperature difference in the loop-type heat pipe 30 by the thermoelectric conversion element 50. For this reason, it is possible to use the electronic device 10 even at a place where it is not possible to secure the external power supply. Thereby, it is possible to increase places where the electronic device 10 can be used.

(2) The light-receiving device 20 includes the collecting lens 21 configured to collect the solar light, and the heat storage material 22 configured to receive the solar light via the collecting lens 21. According to this configuration, the solar light collected by the collecting lens 21 is heat-stored in the heat storage material 22, and heat is input from the heat storage material 22 to the evaporator 31. Thereby, since it is possible to transfer the heat based on the solar light collected by the collecting lens 21 to the evaporator 31 on a surface, it is possible to stably input heat from the heat storage material 22 to the evaporator 31.

(3) The thermoelectric conversion element 50 is arranged in the internal space S1 of the loop structure of the loop-type heat pipe 30. According to this configuration, since the thermoelectric conversion element 50 is provided in the internal space S1 that is not usually used as a component mounting area, it is possible to effectively utilize an unused area, and to suppress enlargement of the electronic device 10.

(4) In the electronic device of the related art, the condenser connected to the temperature-raising part is erected above the cooling part and is then connected to the cooling part so as to secure a distance between the temperature-raising part and the cooling part. For this reason, in the electronic device of the related art, it is difficult to make the electronic device thin in a direction in which the temperature-raising part and the cooling part are aligned side by side each other.

In contrast, in the electronic device 10 of the present embodiment, the loop-type heat pipe 30 has a loop structure having a loop shape, as seen from above, and the thermoelectric conversion element 50 is arranged in the internal space S1 of the loop structure. In addition, the metal layer 41 that constitutes the vapor pipe 32 extends toward the internal space S1 to form the high temperature-side extension part 36A, and the metal layer 42 that constitutes the liquid pipe 34 extends toward the internal space S1 to form the low temperature-side extension part 37A. The high temperature-side extension part 36A is in contact with the upper surface (first surface) of the substrate 51 of the thermoelectric conversion element 50, the low temperature-side extension part 37A is in contact with the lower surface (second surface) of the substrate 52 of the thermoelectric conversion element 50, and the thermoelectric conversion element 50 is positioned between the high temperature-side extension part 36A and the low temperature-side extension part 37A. By these configurations, it is possible to constitute the temperature-raising part 36 by extending the metal layer 41, which constitutes the ceiling part of the vapor pipe 32, on the XY plane, and to constitute the cooling part 37 by extending the metal layer 47, which constitutes the bottom part of the liquid pipe 34, on the XY plane. For this reason, it is possible to suppress the loop-type heat pipe 30 from being enlarged in the Z-axis direction in which the temperature-raising part 36 (high temperature-side extension part 36A) and the cooling part 37 (low temperature-side extension part 37A) are aligned side by side each other. Further, it is possible to suppress the electronic device 10 from being enlarged in the Z-axis direction.

(5) The thermoelectric conversion element 50 is arranged so that the length of the high temperature-side extension part 36A is shorter than the length of the low temperature-side extension part 37A in the Y-axis direction of the internal space S1. According to this configuration, since it is possible to shorten the length of the high temperature-side extension part 36A, it is possible to reduce a heat radiation area of the high temperature-side extension part 36A. For this reason, it is possible to efficiently raise the temperature of substrate 51 by the high temperature-side extension part 36A. In addition, since it is possible to increase the length of the low temperature-side extension part 37A, it is possible to increase a heat radiation area of the low temperature-side extension part 37A. For this reason, it is possible to efficiently lower the temperature of the substrate 52 by the low temperature-side extension part 37A.

OTHER EMBODIMENTS

The above embodiment can be implemented in following modified manners. The above embodiment and the following modified examples can be implemented in combination with each other within a technically consistent scope.

Figure 6:
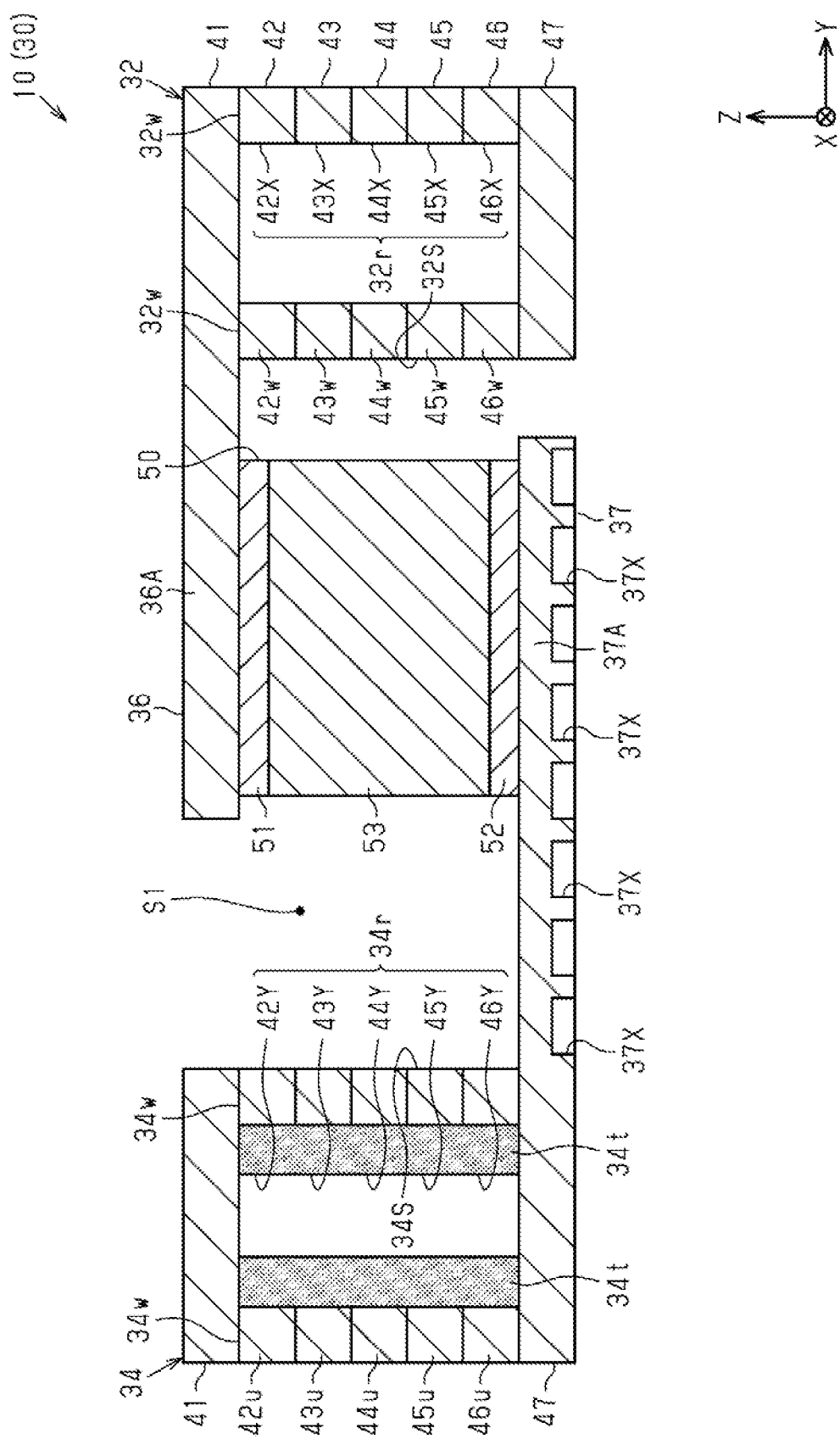
FIG. 6 is a schematic sectional view showing a loop-type heat pipe and a thermoelectric conversion element according to a modified embodiment.

As shown in FIG. 6, a patterning may be implemented on the low temperature-side extension part 37A. For example, an outer surface (here, lower surface) of the low temperature-side extension part 37A may be formed with a plurality of concave portions 37X. The plurality of concave portions 37X is provided side by side at intervals in the Y-axis direction, for example. The plurality of concave portions 37X is provided side by side at intervals in the X-axis direction, for example. In addition, each of the concave portions 37X may be formed into a groove shape to extend in the X-axis direction, for example.

According to this configuration, since it is possible to reduce a volume of the metal layer 47 that constitutes the low temperature-side extension part 37A, it is possible to reduce heat conduction due to the material-specific thermal conductivity of the metal layer 47. In addition, the plurality of concave portions 37X is formed, so that a surface area of the low temperature-side extension part 37A can be increased, and therefore, the heat radiation area can be increased. Thereby, since it is possible to more easily lower the temperature of the low temperature-side extension part 37A, it is possible to further lower the temperature of the substrate 52 of the thermoelectric conversion element 50.

In the modified example shown in FIG. 6, the number and size of the concave portions 37X are not particularly limited.

Figure 7:
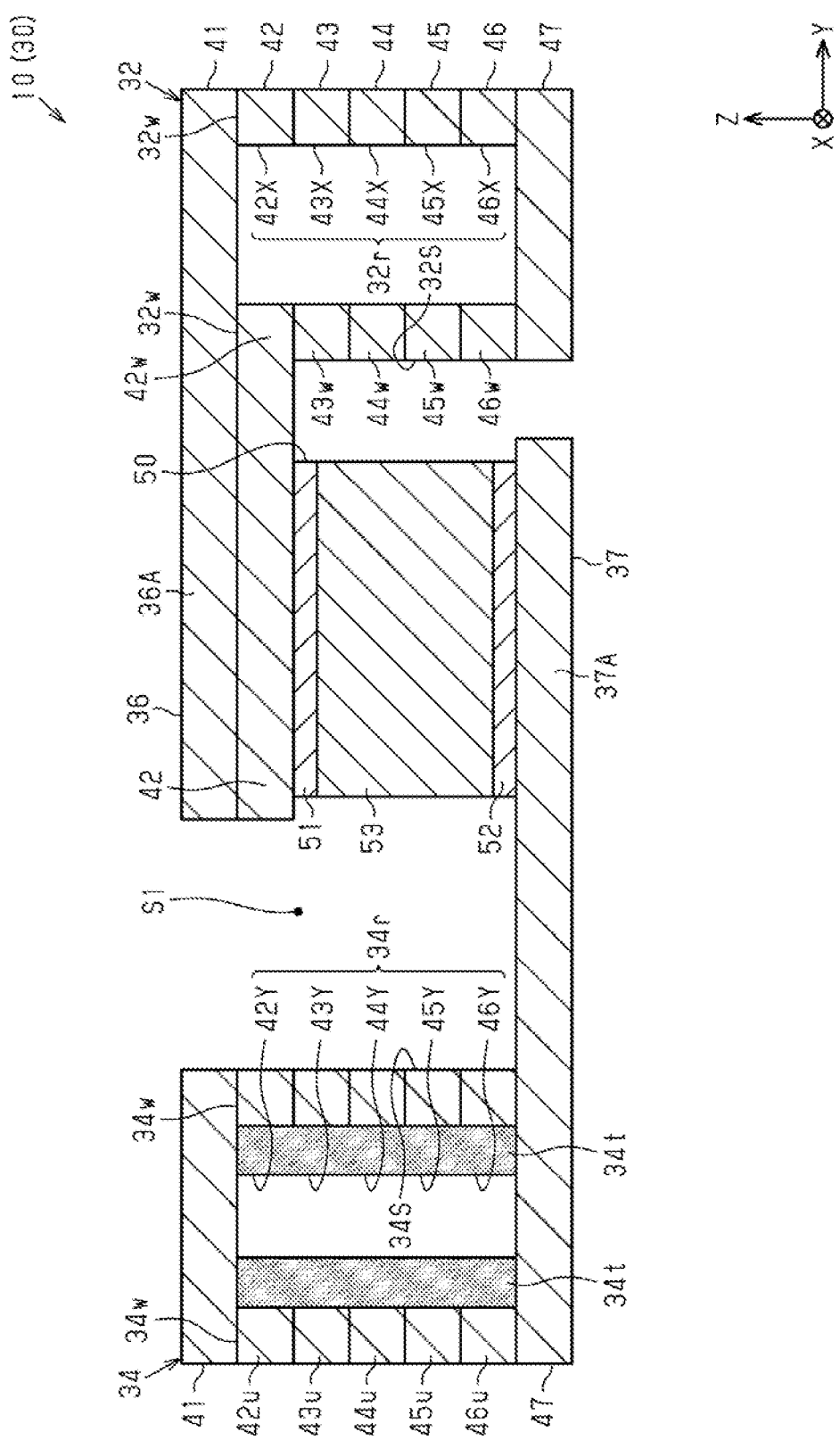
FIG. 7 is a schematic sectional view showing a loop-type heat pipe and a thermoelectric conversion element according to a modified embodiment.

As shown in FIG. 7, the metal layer of the high temperature-side extension part 36A may be formed thicker than the metal layer of the low temperature-side extension part 37A. In the above embodiment, the high temperature-side extension part 36A is constituted only by the metal layer 41 that is an outer metal layer. However, for example, the high temperature-side extension part 36A may be constituted by the metal layer 41 and a part of the intermediate metal layers. In this modified example, the high temperature-side extension part 36A is constituted by the metal layer 41 and the metal layer 42 that is positioned at the uppermost layer of the intermediate metal layers. In this modified example, the high temperature-side extension part 36A is formed by the metal layers 41 and 42, which constitute the vapor pipe 32, extending from the outer surface 32S of the pipe wall 32w toward the liquid pipe 34. In the high temperature-side extension part 36A of this modified example, a lower surface of the metal layer 42 is in contact with the upper surface of the substrate 51.

According to this configuration, since it is possible to increase a volume of the metal layers 41 and 42 that constitute the high temperature-side extension part 36A, it is possible to increase heat conduction due to the material-specific thermal conductivities of the metal layers 41 and 42. Thereby, since it is possible to easily raise the temperature of the high temperature-side extension part 36A, it is possible to further raise the temperature of the substrate 51 of the thermoelectric conversion element 50.

In the modified example shown in FIG. 7, the number of metal layers that constitute the high temperature-side extension part 36A is not particularly limited. For example, the high temperature-side extension part 36A may be constituted by the three layers of the metal layers 41, 42 and 43.

In the modified example shown in FIG. 7, the metal layer of the high temperature-side extension part 36A is formed thicker than the metal layer of the low temperature-side extension part 37A by increasing the number of layers of the metal layers 41 and 42 that constitute the high temperature-side extension part 36A. However, the present invention is not limited thereto. For example, the metal layer of the high temperature-side extension part 36A may be formed thicker than the metal layer of the low temperature-side extension part 37A by forming the metal layer 41 to be thicker than the metal layer 47.

In the above embodiment, the high temperature-side extension part 36A is formed by extending the metal layer 41 that constitutes the vapor pipe 32. However, the structure of the high temperature-side extension part 36A is not limited thereto.

Figure 8:
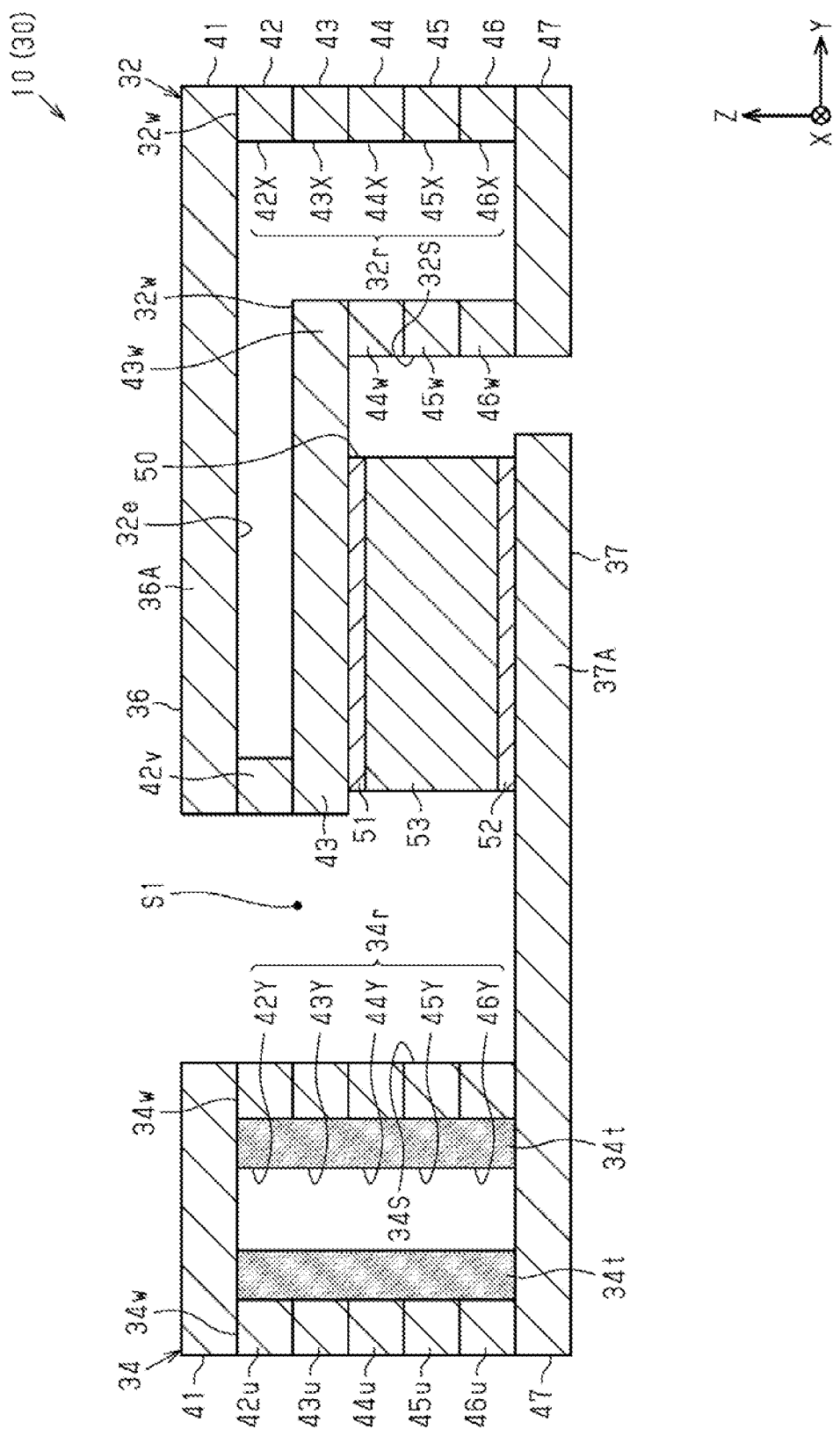
FIG. 8 is a schematic sectional view showing a loop-type heat pipe and a thermoelectric conversion element according to a modified embodiment.

For example, as shown in FIG. 8, the high temperature-side extension part 36A may be formed by extending the flow path 32r of the vapor pipe 32. In this modified example, the high temperature-side extension part 36A is constituted by the metal layer 41 that is an outer metal layer, the metal layers 42 and 43 that are intermediate metal layers, and an expanded flow path 32e formed by the metal layers 41, 42, and 43. The metal layers 41 and 43 that constitute the high temperature-side extension part 36A are formed to extend from the outer surface 32S of the pipe wall 32w toward the liquid pipe 34 along the Y-axis direction, for example. The metal layer 42 that constitutes the high temperature-side extension part 36A has a wall part 42V provided at a tip end portion of the high temperature-side extension part 36A, for example. Although not shown, the metal layer 42 that constitutes the high temperature-side extension part 36A has wall parts provided at both ends in the X-axis direction of the high temperature-side extension part 36A and extending from the outer surface 32S of the pipe wall 32w toward the liquid pipe 34 along the Y-axis direction. The expanded flow path 32e is constituted by a space surrounded by the metal layers 41, 42 and 43 protruding from the outer surface 32S of the pipe wall 32w toward the liquid pipe 34, for example. Specifically, parts of the metal layers 41, 42 and 43 more protruding toward the liquid pipe 34 than the outer surface 32S constitute the wall parts defining the expanded flow path 32e. The expanded flow path 32e is formed to communicate with the flow path 32r. For this reason, the vapor Cv (refer to FIG. 3) flows through the expanded flow path 32e, similar to the flow path 32r. In the high temperature-side extension part 36A of this modified example, a lower surface of the metal layer 43 is in contact with the upper surface of the substrate 51.

According to this configuration, since the vapor Cv flows through the expanded flow path 32e that constitutes the high temperature-side extension part 36A, it is possible to raise the temperature of the substrate 51 by the latent heat. Thereby, it is possible to raise the temperature of the substrate 51 more efficiently.

In the above embodiment, the high temperature-side extension part 36A and the low temperature-side extension part 37A are formed to extend in parallel to the Y-axis direction. However, the present invention is not limited thereto.

Figure 9:
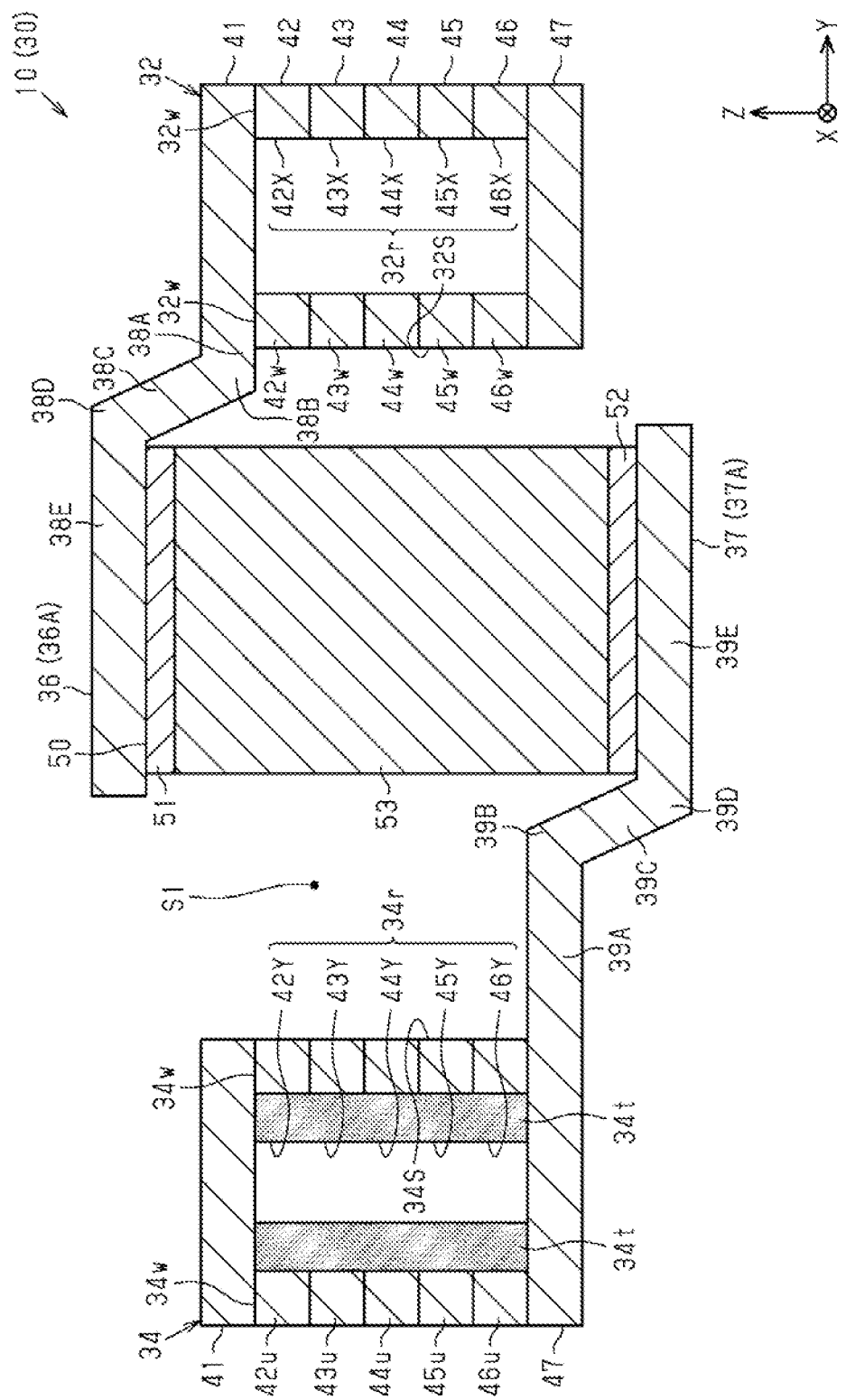
FIG. 9 is a schematic sectional view showing a loop-type heat pipe and a thermoelectric conversion element according to a modified embodiment.

For example, as shown in FIG. 9, the high temperature-side extension part 36A may be formed bent. In this modified example, the high temperature-side extension part 36A has a linear portion 38A, a bent portion 38B, a linear portion 38C, a bent portion 38D, and a linear portion 38E. The linear portion 38A is formed to extend in a linear shape from the outer surface 32S of the pipe wall 32w toward the liquid pipe 34 along the Y-axis direction. The bent portion 38B is formed to be bent upward from an end portion of the linear portion 38A. The linear portion 38C is formed to extend in a linear shape obliquely upward from the bent portion 38B. The linear portion 38C extends in a linear shape in a left upper direction of FIG. 9, for example. The linear portion 38C extends in a direction of intersecting with all of the X-axis direction, the Y-axis direction and the Z-axis direction, for example. The bent portion 38D is formed to be bent from an end portion of the linear portion 38C toward the Y-axis direction. The linear portion 38E is formed to extend in a linear shape from the bent portion 38D toward the liquid pipe 34 along the Y-axis direction. In the high temperature-side extension part 36A of this modified example, a lower surface of the linear portion 38E is in contact with the upper surface of the substrate 51.

Similarly, the low temperature-side extension part 37A may be formed bent. In this modified example, the low temperature-side extension part 37A has a linear portion 39A, a bent portion 39B, a linear portion 39C, a bent portion 39D, and a linear portion 39E. The linear portion 39A is formed to extend in a linear shape from the outer surface 34S of the pipe wall 34w toward the liquid pipe 32 along the Y-axis direction. The bent portion 39B is formed to be bent downward from an end portion of the linear portion 39A. The linear portion 39C is formed to extend in a linear shape obliquely downward from the bent portion 39B. The linear portion 39C extends in a linear shape in a right lower direction of FIG. 9, for example. The linear portion 39C extends in a direction of intersecting with all of the X-axis direction, the Y-axis direction and the Z-axis direction, for example. The bent portion 39D is formed to be bent from an end portion of the linear portion 39C toward the Y-axis direction. The linear portion 39E is formed to extend in a linear shape from the bent portion 39D toward the vapor pipe 32 along the Y-axis direction. In the low temperature-side extension part 37A of this modified example, an upper surface of the linear portion 39E is in contact with the lower surface of the substrate 52.

According to this configuration, it is possible to secure a great height in the Z-axis direction between the linear portion 38E of the high temperature-side extension part 36A and the linear portion 39E of the low temperature-side extension part 37A. Thereby, even when a height of the thermoelectric conversion element 50 in the Z-axis direction becomes greater than a height between the metal layers 41 and 47, it is possible to favorably arrange the thermoelectric conversion element 50 between the high temperature-side extension part 36A and the low temperature-side extension part 37A.

In the modified example shown in FIG. 9, both the high temperature-side extension part 36A and the low temperature-side extension part 37A are bent. However, only one of the high temperature-side extension part 36A and low temperature-side extension part 37A may also be bent.

In the above embodiment, the light-receiving device 20 is constituted by one collecting lens 21 and one heat storage material 22. However, the present invention is not limited thereto.

Figure 10:
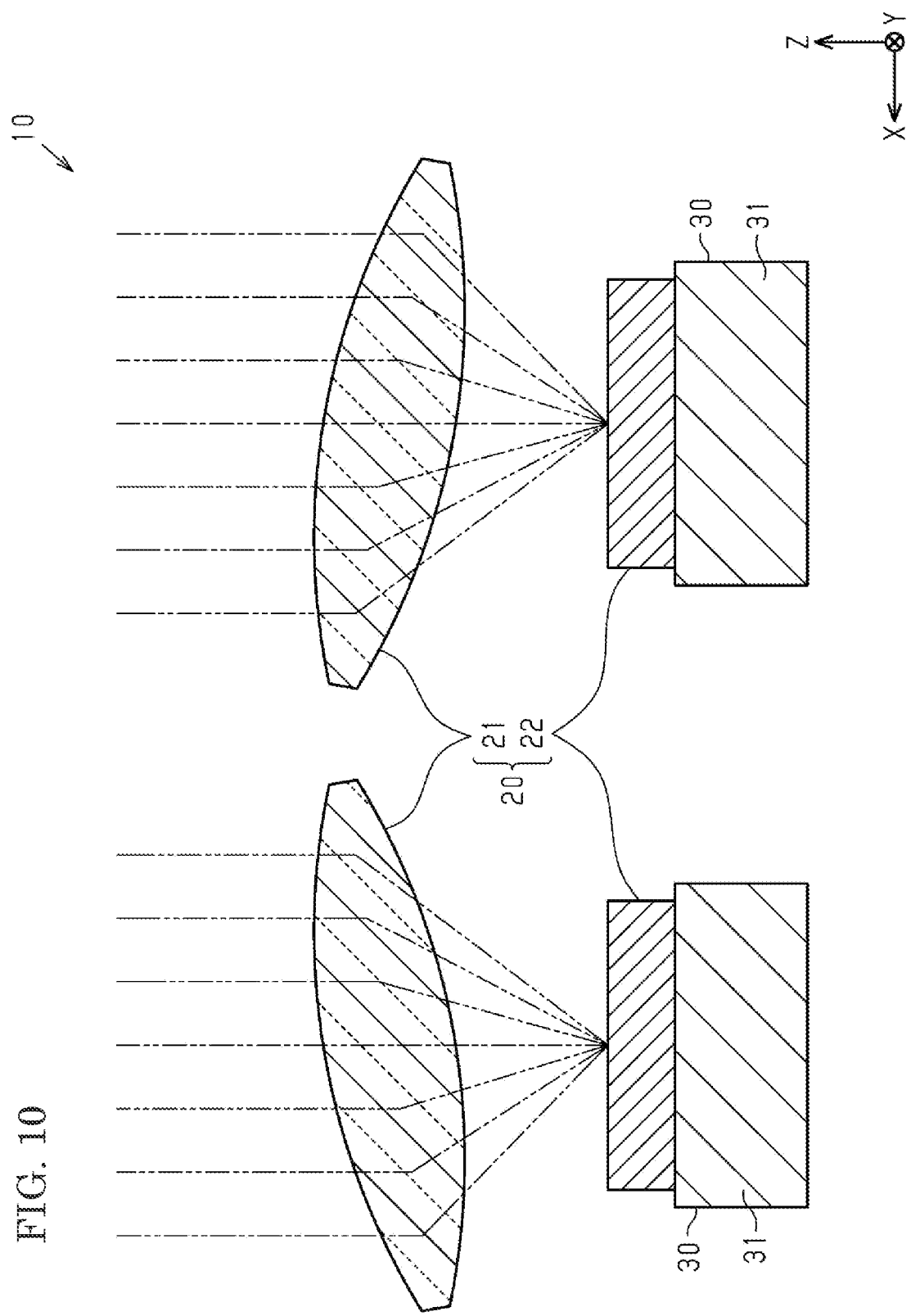
FIG. 10 is a schematic configuration view showing an electronic device according to a modified embodiment.

For example, as shown in FIG. 10, the light-receiving device 20 may be constituted by a plurality of (here, two) collecting lenses 21 and a plurality of (here, two) heat storage materials 22. In this case, the plurality of collecting lenses 21 is preferably installed at angles different from each other. According to this configuration, since it is possible to collect the solar light by the plurality of collecting lenses 21 installed at angles different from each other, it is possible to reduce variation in light collection depending on a position of the sun.

In this modified example, the heat storage materials 22 are each provided for each of the plurality of collecting lenses 21. Each of the heat storage materials 22 is provided to overlap each of the collecting lenses 21, as seen from above. Each of the heat storage materials 22 receives the solar light (refer to the dashed-two dotted line) collected by each of the collecting lenses 21. In addition, the loop-type heat pipe 30 of this modified example has a plurality of (here, two) evaporators 31 corresponding to the plurality of the heat storage materials 22. The plurality of heat storage materials 22 is individually fixed in close contact with the upper surfaces of the plurality of evaporators 31. The plurality of evaporators 31 is provided at intervals in the X-axis direction, for example. The plurality of evaporators 31 is aligned side by side in the X-axis direction, for example.

Figure 11:
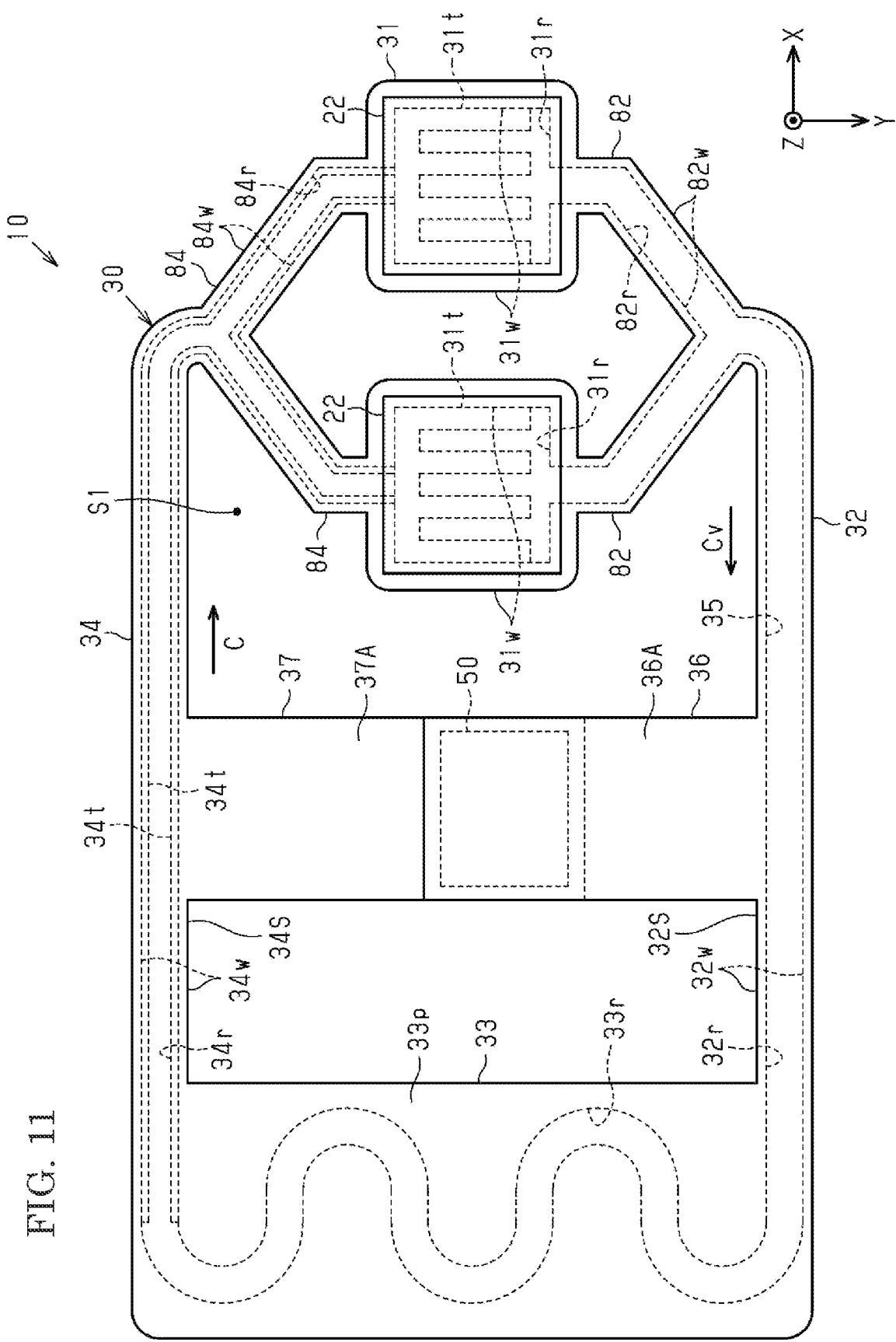
FIG. 11 is a schematic plan view showing the electronic device according to the modified embodiment.

As shown in FIG. 11, the loop-type heat pipe 30 of this modified example has the plurality of evaporators 31, a plurality of branched vapor pipes 82, the vapor pipe 32, the condenser 33, the liquid pipe 34 and a plurality of branched liquid pipes 84. The plurality of evaporators 31 is individually connected to the plurality of branched vapor pipes 82. Each of the branched vapor pipes 82 has, for example, a pair of pipe walls 82s provided on both sides in a width direction orthogonal to a length direction of the branched vapor pipe 82, as seen from above, and a flow path 82r provided between the pair of pipe walls 82w. The plurality of branched vapor pipes 82 is connected to one vapor pipe 32. Specifically, the plurality of branched vapor pipes 82 joins to one vapor pipe 32. Each of the flow paths 82r is formed to communicate with the flow path 31r of each evaporator 31 and the flow path 32r of the vapor pipe 32. Each of the flow paths 82r is a part of the loop-shaped flow path 35. One liquid pipe 34 is branched into the plurality of branched liquid pipes 84. The plurality of branched liquid pipes 84 is individually connected to the plurality of evaporators 31. Each of the branched liquid pipes 84 has, for example, a pair of pipe walls 84w provided on both sides in a width direction orthogonal to a length direction of the branched liquid pipe 84, as seen from above, and a flow path 84r provided between the pair of pipe walls 84w. Each of the flow paths 84r is formed to communicate with the flow path 34r of the liquid pipe 34 and the flow path 31r of each evaporator 31. Each of the flow paths 84r is a part of the loop-shaped flow path 35.

In the modified example shown in FIGS. 10 and 11, the two heat storage materials 22 each corresponding to each of the two collecting lenses 21 are provided. The present invention is not limited thereto. For example, one heat storage material 22 may be provided for the plurality of collecting lenses 21. In this case, the solar light collected by the plurality of collecting lenses 21 is received by one heat storage material 22. In this case, the loop-type heat pipe 30 has one evaporator 31 corresponding to one heat storage material 22.

In the above embodiment, in the internal space S1 of the loop structure of the loop-type heat pipe 30, the thermoelectric conversion element 50 is arranged so that the distance between the vapor pipe 32 and the thermoelectric conversion element 50 in the Y-axis direction is shorter than the distance between the liquid pipe 34 and the thermoelectric conversion element 50 in the Y-axis direction. However, the present invention is not limited thereto. For example, the thermoelectric conversion element 50 may be arranged in the internal space S1 so that the distance between the vapor pipe 32 and the thermoelectric conversion element 50 in the Y-axis direction is the same as the distance between the liquid pipe 34 and the thermoelectric conversion element 50 in the Y-axis direction. In addition, the thermoelectric conversion element 50 may be arranged in the internal space S1 so that the distance between the vapor pipe 32 and the thermoelectric conversion element 50 in the Y-axis direction is longer than the distance between the liquid pipe 34 and the thermoelectric conversion element 50 in the Y-axis direction.

In the above embodiment, the high-temperature part of the loop-type heat pipe 30 that is connected to the substrate 51 on the high temperature-side of the thermoelectric conversion element 50 is embodied in the vapor pipe 32. For example, in the above embodiment, the high temperature-side extension part 36A is formed to extend from the vapor pipe 32. However, the present invention is not limited thereto.

Figure 12:
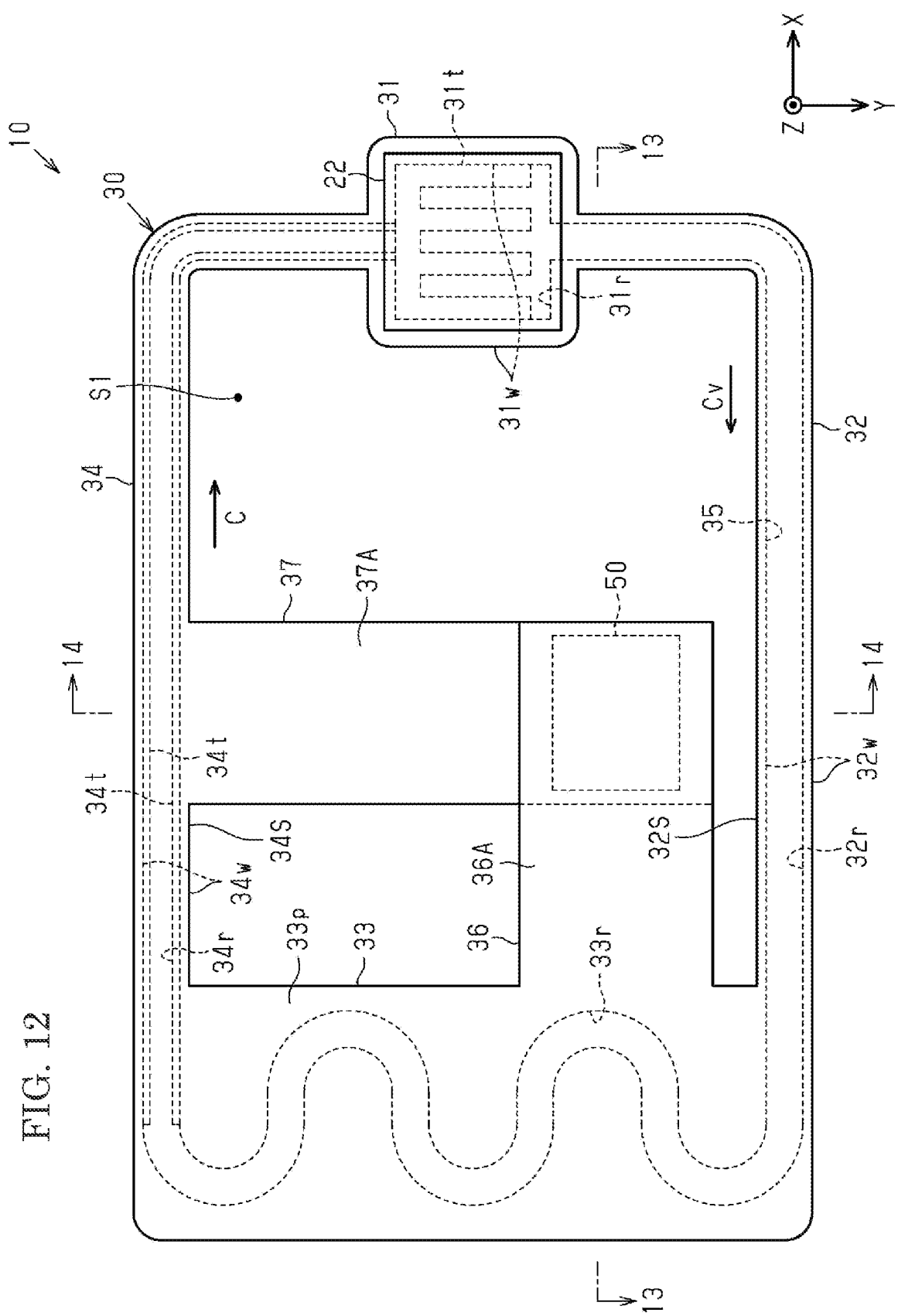
FIG. 12 is a schematic plan view showing an electronic device according to a modified embodiment.
Figure 13:
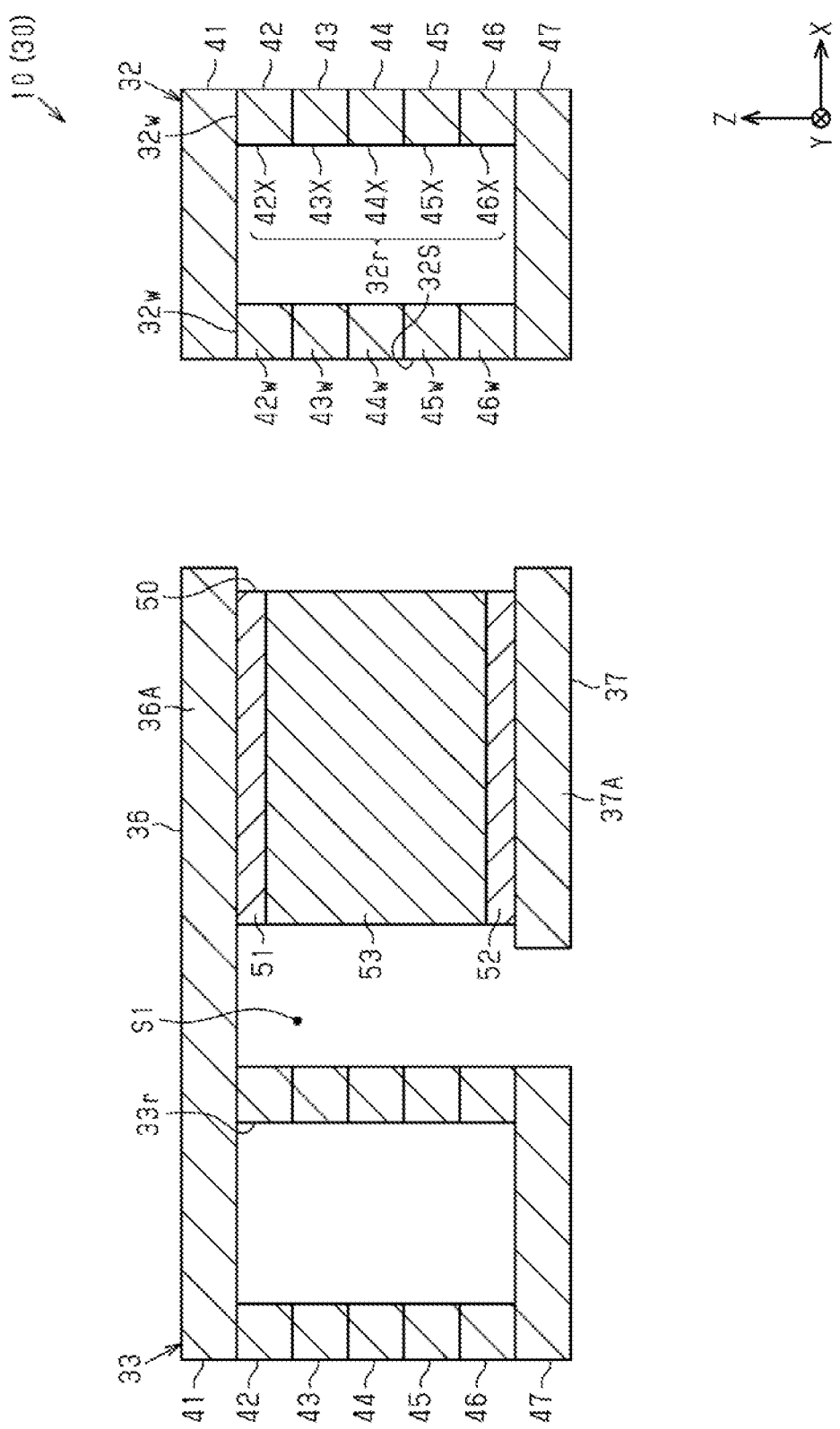
FIG. 13 is a schematic sectional view (a sectional view taken along a 13-13 line in FIG. 12) showing a loop-type heat pipe and a thermoelectric conversion element according to the modified embodiment.
Figure 14:
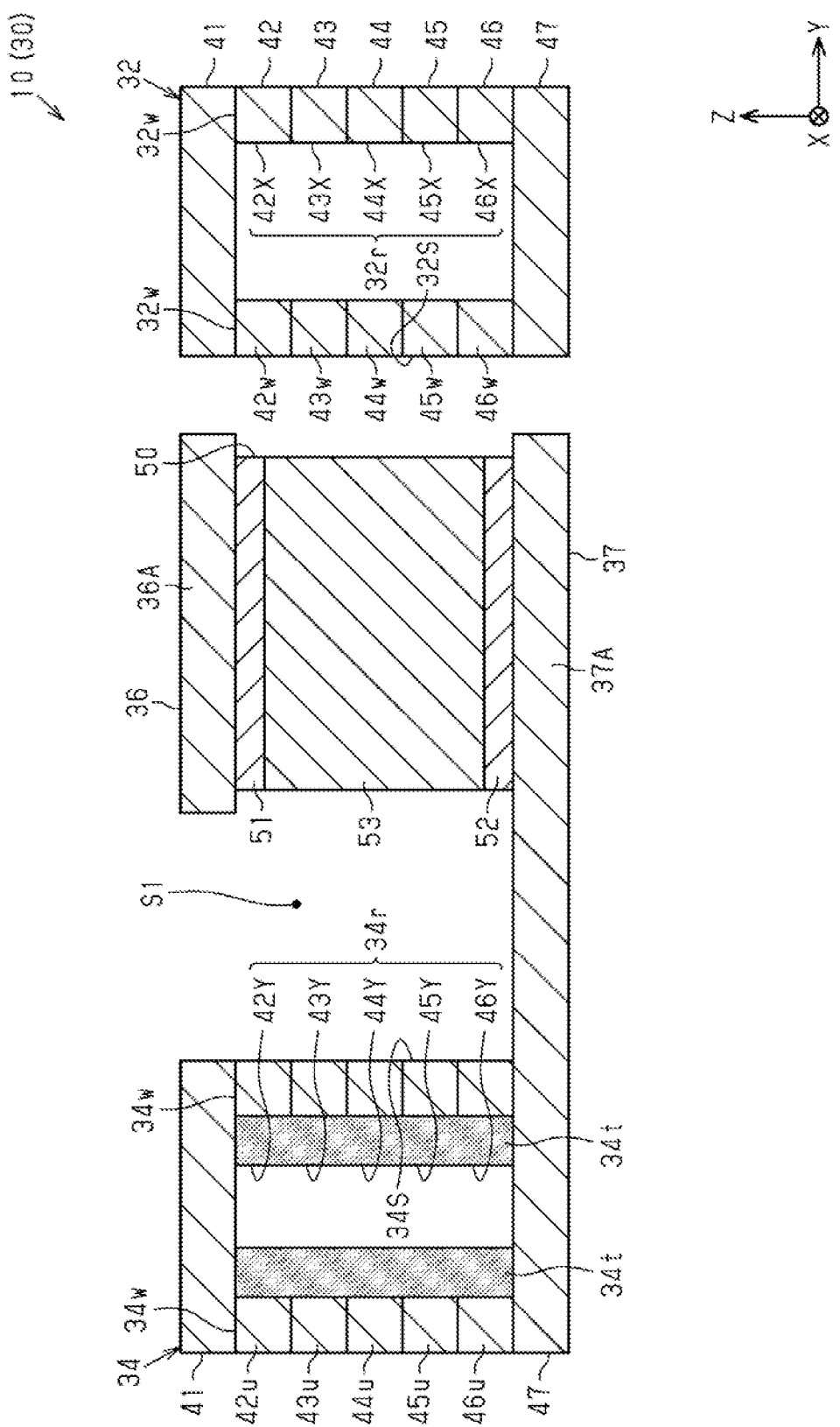
FIG. 14 is a schematic sectional view (a sectional view taken along a 14-14 line in FIG. 12) showing the loop-type heat pipe and the thermoelectric conversion element according to the modified embodiment.

For example, as shown in FIG. 12, the high temperature-side extension part 36A may be formed to extend from a part, which is positioned on the vapor pipe 32-side, of the condenser 33 toward the internal space S1. As shown in FIGS. 12 and 13, the high temperature-side extension part 36A of this modified example is formed to extend from the condenser 33 in the X-axis direction. The high temperature-side extension part 36A of this modified example extends from the condenser 33 toward the evaporator 31 along the X-axis direction. As shown in FIG. 13, the high temperature-side extension part 36A of this modified example is formed so that the metal layer 41 constituting the condenser 33 extends from the condenser 33 toward the internal space S1. The high temperature-side extension part 36A is in contact with the upper surface of the substrate 51. In this modified example, the high-temperature part of the loop-type heat pipe 30 that is connected to the substrate 51 on the high temperature-side of the thermoelectric conversion element 50 becomes the condenser 33. In addition, as shown in FIG. 12, the low temperature-side extension part 37A of this modified example is formed to extend from the liquid pipe 34 in the Y-axis direction. Specifically, the low temperature-side extension part 37A of this modified example extends in a direction of intersecting with the direction (here, the X-axis direction) in which the high temperature-side extension part 36A extends, as seen from above. The thermoelectric conversion element 50 is provided at a part at which the low temperature-side extension part 37A and the high temperature-side extension part 36A intersect, as seen from above. As shown in FIG. 14, the low temperature-side extension part 37A is in contact with the lower surface of the substrate 52. Note that, the high temperature-side extension part 36A of this modified example is provided separate from the vapor pipe 32 and is not connected to the vapor pipe 32.

Figure 15:
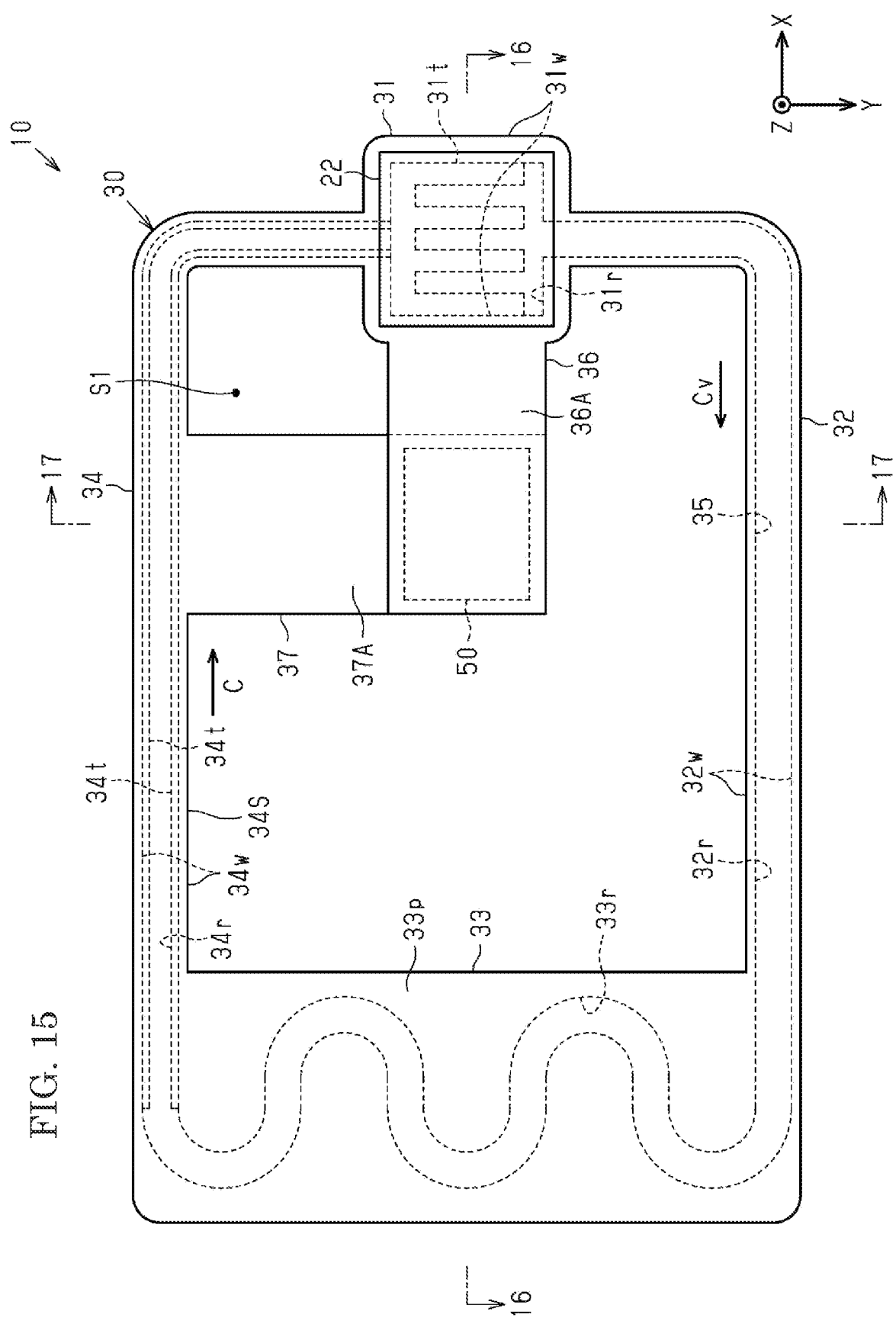
FIG. 15 is a schematic plan view showing an electronic device according to a modified embodiment.
Figure 16:
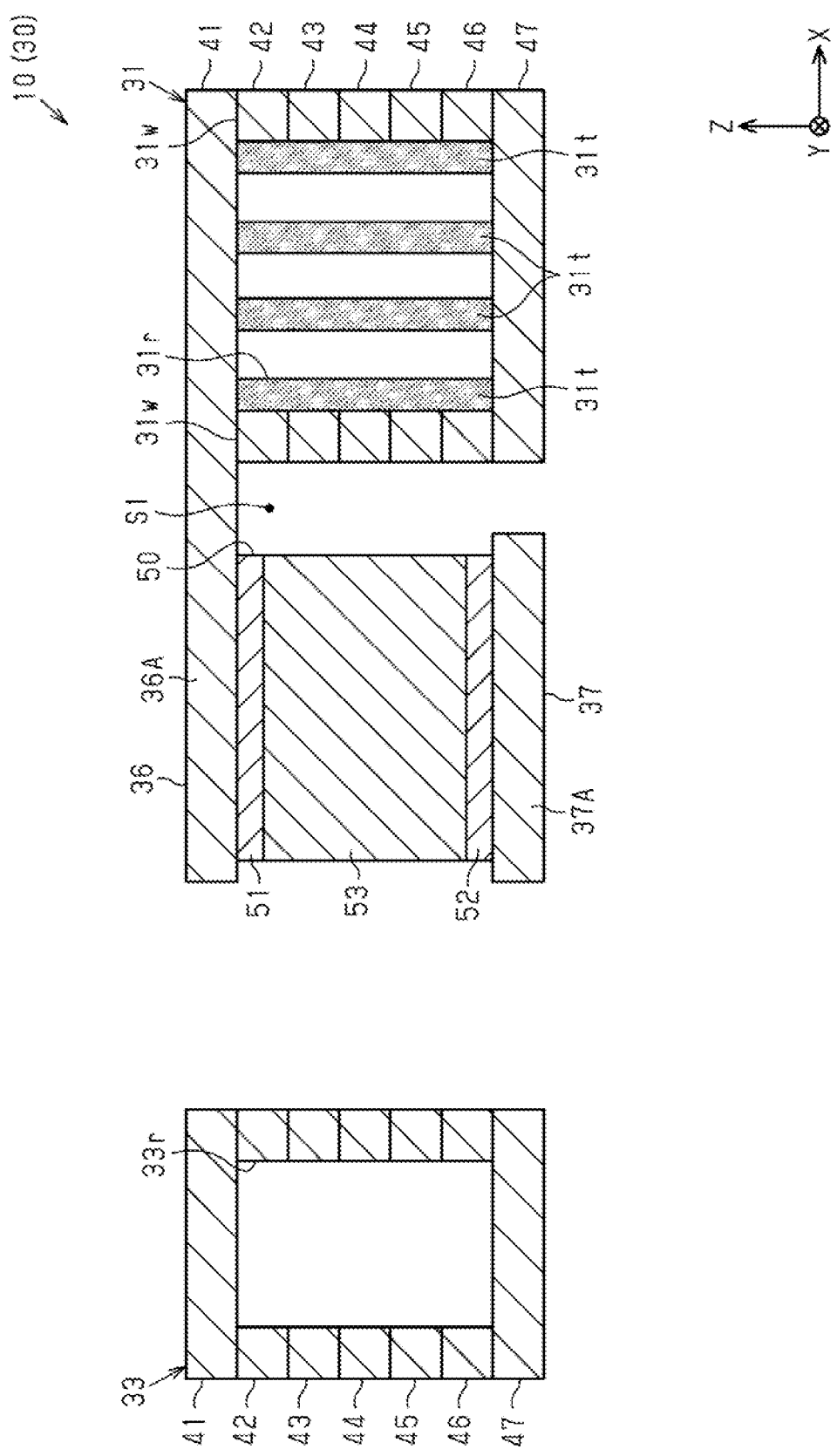
FIG. 16 is a schematic sectional view (a sectional view taken along a 16-16 line in FIG. 15) showing the loop-type heat pipe and the thermoelectric conversion element according to the modified embodiment.
Figure 17:
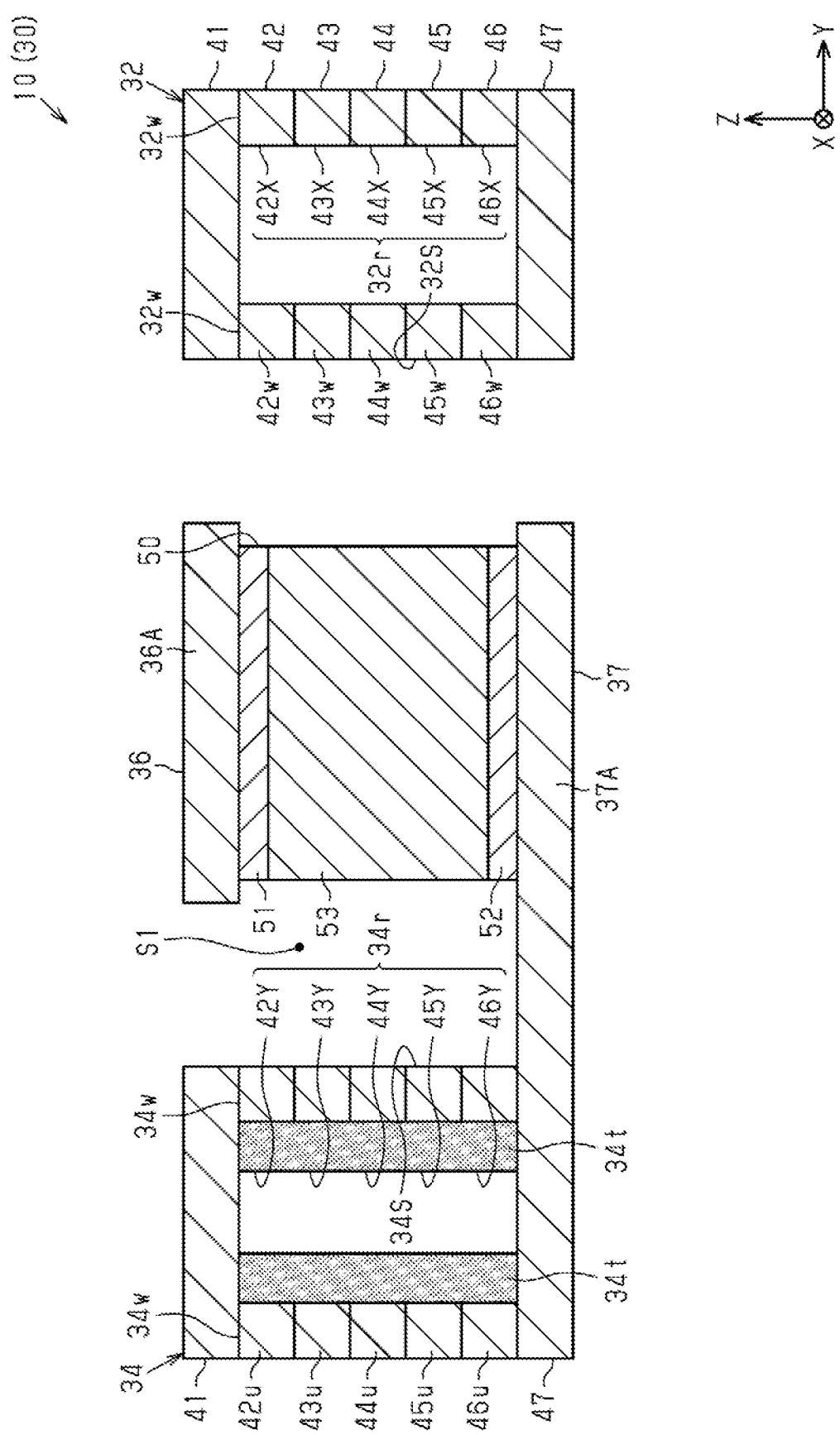
FIG. 17 is a schematic sectional view (a sectional view taken along a 17-17 line in FIG. 15) showing the loop-type heat pipe and the thermoelectric conversion element according to the modified embodiment.

For example, as shown in FIG. 15, the high temperature-side extension part 36A may be formed to extend from the evaporator 31 toward the internal space S1. As shown in FIGS. 15 and 16, the high temperature-side extension part 36A of this modified example is formed to extend from the evaporator 31 in the X-axis direction. The high temperature-side extension part 36A of this modified example extends from the evaporator 31 toward the condenser 33 along the X-axis direction. As shown in FIG. 16, the high temperature-side extension part 36A of this modified example is formed so that the metal layer 41 constituting the evaporator 31 extends from the evaporator 31 toward the internal space S1. The high temperature-side extension part 36A is in contact with the upper surface of the substrate 51. In this modified example, the high-temperature part of the loop-type heat pipe 30 that is connected to the substrate 51 on the high temperature-side of the thermoelectric conversion element 50 becomes the evaporator 31. In addition, as shown in FIG. 15, the low temperature-side extension part 37A of this modified example is formed to extend from the liquid pipe 34 in the Y-axis direction. Specifically, the low temperature-side extension part 37A of this modified example extends in a direction of intersecting with the direction (here, the X-axis direction) in which the high temperature-side extension part 36A extends, as seen from above. The thermoelectric conversion element 50 is provided at a part at which the low temperature-side extension part 37A and the high temperature-side extension part 36A intersect with each other, as seen from above. As shown in FIG. 17, the low temperature-side extension part 37A is in contact with the lower surface of the substrate 52. Note that, the high temperature-side extension part 36A of this modified example is provided separate from the vapor pipe 32 and is not connected to the vapor pipe 32.

In the above embodiment, the high temperature-side extension part 36A and the low temperature-side extension part 37A are formed to extend toward the internal space S1 of the loop-type heat pipe 30. However, the present invention is not limited thereto. For example, the high temperature-side extension part 36A and the low temperature-side extension part 37A may be formed to extend toward an outer side of the loop structure of the loop-type heat pipe 30. In this case, the thermoelectric conversion element 50 is arranged on the outer side of the loop structure of the loop-type heat pipe 30.

In the above embodiment, the high temperature-side extension part 36A is constituted by the metal layer 41 that is an outer metal layer on the upper side, and the low temperature-side extension part 37A is constituted by the metal layer 47 that is an outer metal layer on the lower side. However, the present invention is not limited thereto. For example, the high temperature-side extension part 36A may be constituted by the metal layer 47 that is an outer metal layer on the lower side, and the low temperature-side extension part 37A may be constituted by the metal layer 41 that is an outer metal layer on the upper side.

In the above embodiment, the high temperature-side extension part 36A is in contact with the upper surface (first surface) of the substrate 51 of the thermoelectric conversion element 50, and the low temperature-side extension part 37A is in contact with the lower surface (second surface) of the substrate 52 of the thermoelectric conversion element 50. However, the present invention is not limited thereto.

Figure 18:
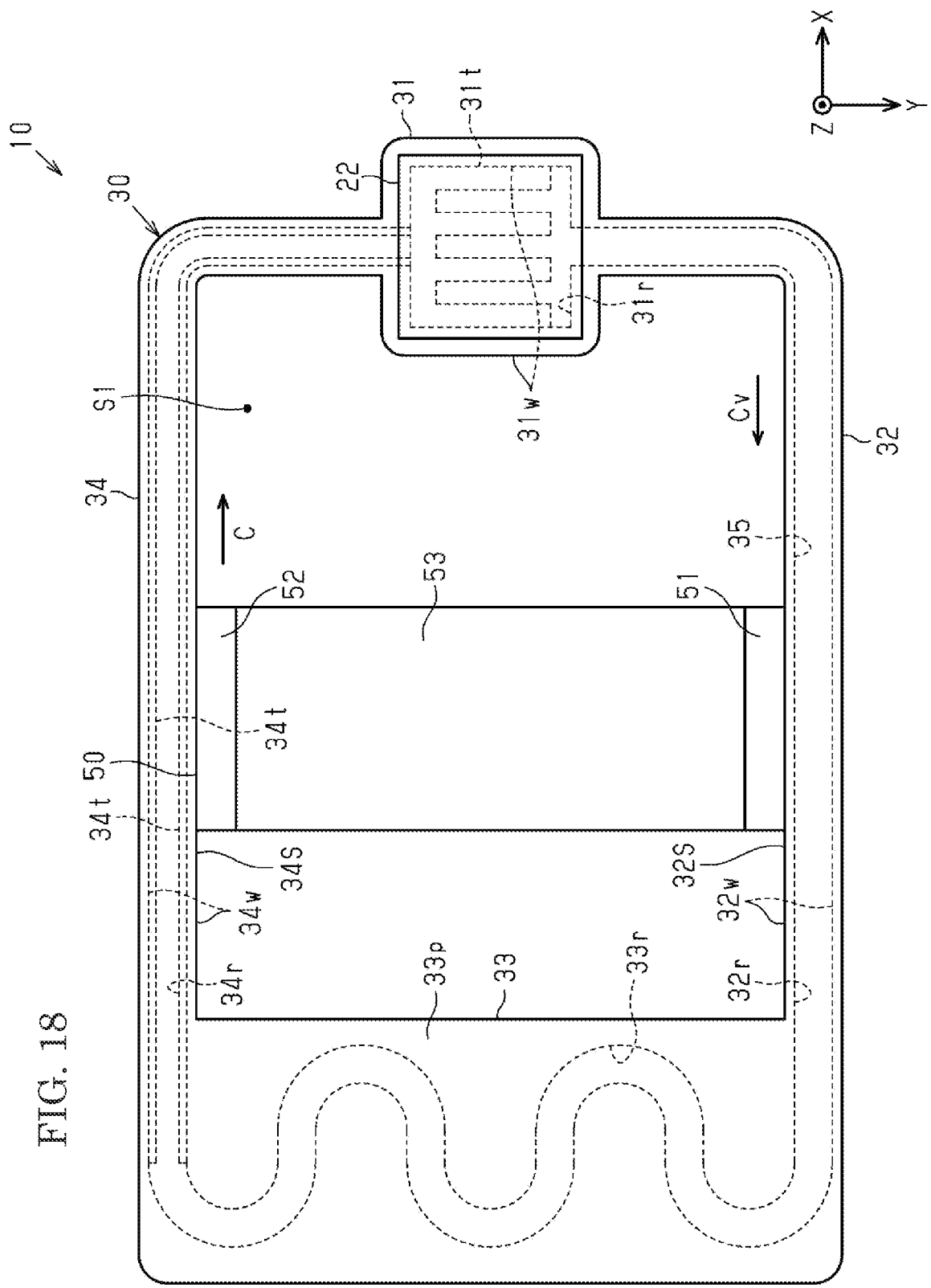
FIG. 18 is a schematic plan view showing an electronic device according to a modified embodiment.

For example, as shown in FIG. 18, the high temperature-side extension part 36A and the low temperature-side extension part 37A may be omitted. In this case, for example, the first surface of the substrate 51 of the thermoelectric conversion element 50 may be in direct contact with the pipe walls 32w of the vapor pipe 32, and the second surface of the substrate 52 of the thermoelectric conversion element 50 may be in direct contact with the pipe walls 34w of the liquid pipe 34. In the thermoelectric conversion element 50 of this modified example, a plurality of thermoelectric elements 53 is sandwiched in the Y-axis direction by the substrate 51 and the substrate 52. The thermoelectric conversion element 50 of this modified embodiment is positioned between the pipe walls 32w of the vapor pipe 32 and the pipe walls 34w of the liquid pipe 34. The thermoelectric conversion element 50 of this modified example is arranged in the internal space S1 of the loop structure.

In the above embodiment, the high-temperature part of the loop-type heat pipe 30 is in contact with the upper surface (first surface) of the substrate 51 of the thermoelectric conversion element 50, and the low-temperature part of the loop-type heat pipe 30 is in contact with the lower surface (second surface) of the substrate 52 of the thermoelectric conversion element 50. However, the present invention is not limited thereto. For example, the high-temperature part of the loop-type heat pipe 30 may be in contact with the upper surface (first surface) of the substrate 51, and the lower surface (second surface) of the substrate 52 may be configured as an atmosphere contact surface.

In the case 70 of the above embodiment, a heat insulating material, a shield plate or the like may be provided between the respective components such as the loop-type heat pipe 30, the controller 60, the battery 61 and the inverter 62.

The internal configuration of the case 70 of the above embodiment is not particularly limited. For example, a converter configured to step up or down the electric power generated in the thermoelectric conversion element 50 to a predetermined voltage may be provided. The inverter 62 may be omitted.

In the above embodiment, the electric power generated in the thermoelectric conversion element 50 is supplied to the external device via the external port 63. However, the present invention is not limited thereto. For example, the electric power generated in the thermoelectric conversion element 50 may be supplied to an electronic component provided inside the case 70.

The configuration of the thermoelectric conversion element 50 of the above embodiment is not particularly limited. For example, the sizes of the substrates 51 and 52, the number of the thermoelectric elements 53, and the like can be changed as appropriate. In addition, the thermoelectric conversion element 50 may be embodied into a multi-layered type where a plurality of layers of the thermoelectric element 53 is provided.

In the above embodiment, the collecting lens 21 is embodied as a collecting part configured to collect the solar light. However, the present invention is not limited thereto. For example, a collecting mirror may be embodied as the collecting part.

The collecting lens 21 of the above embodiment may be omitted. In this case, for example, the solar light is incident into the case 70 from the lighting window 70X. At this time, the heat storage material 22 receives the solar light via the lighting window 70X.

The heat storage material 22 of the above embodiment may be omitted. In this case, for example, the solar light collected by the collecting lens 21 is directly irradiated to the evaporator 31. In this case, the evaporator 31 also functions as the light-receiving device configured to receive the solar light.

In the above embodiment, the solar light is used as the natural energy for inputting heat to the evaporator 31 of the loop-type heat pipe 30. However, the present invention is not limited thereto. As the natural energy for inputting heat to the evaporator 31, geothermal energy or the like may also be used.

Figure 19:
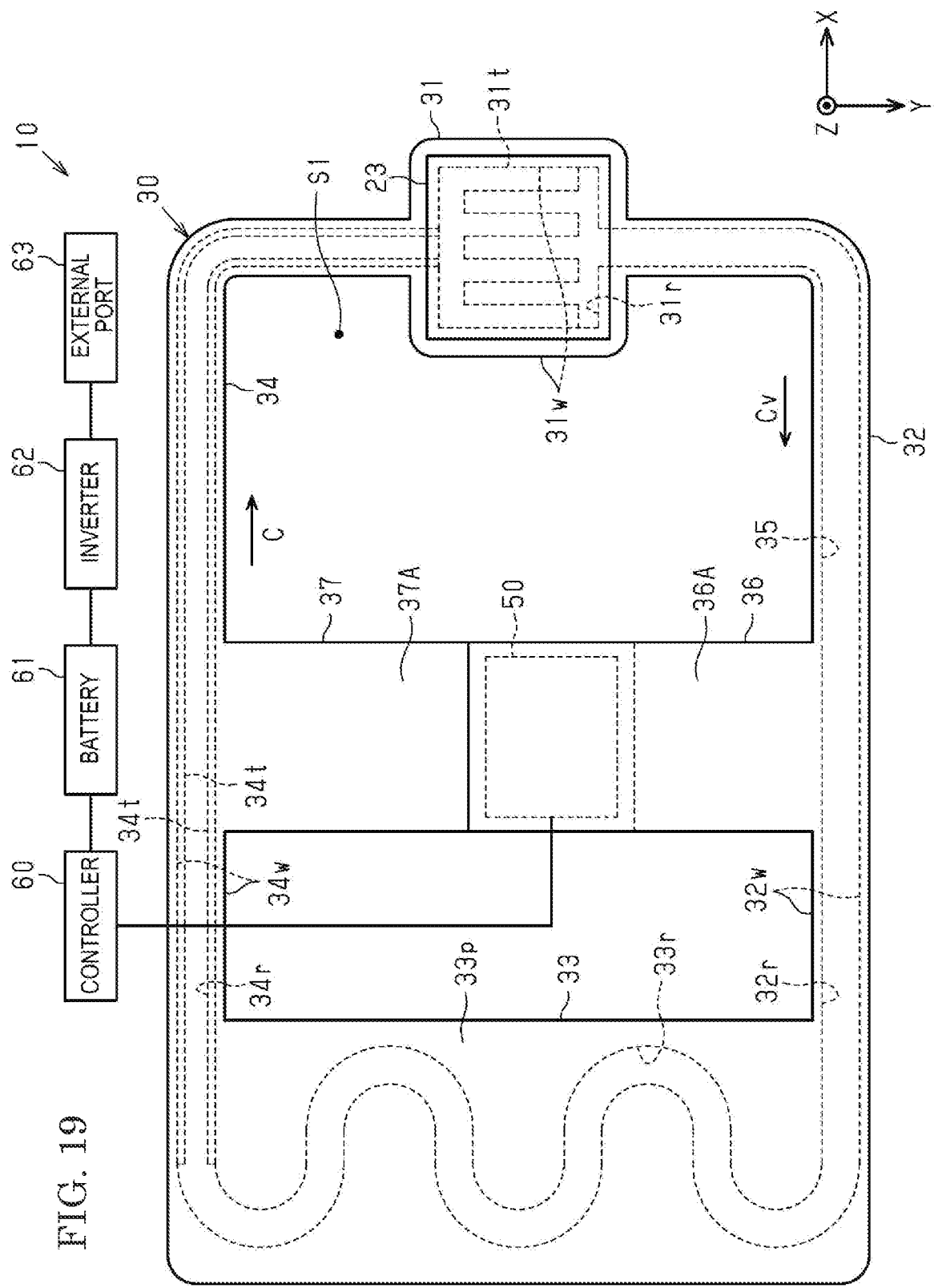
FIG. 19 is a schematic configuration view showing an electronic device according to a modified embodiment.

For example, as shown in FIG. 19, the heat-generating component 23 may be fixed in close contact with the upper surface of the evaporator 31 of the loop-type heat pipe 30. As the heat-generating component, for example, a CPU and the like may be used. In this case, the heat-generating component 23 becomes a heat source, and an external power supply for driving the heat-generating component 23 is required. However, since the thermoelectric conversion element 50 is provided in the internal space S1 of the loop structure so as to be positioned between the high temperature-side extension part 36A and the low temperature-side extension part 37A, the operational effects similar to the above embodiments (3) and (4) can be obtained.

In the modified example shown in FIG. 19, an element different from the thermoelectric conversion element 50 may be provided between the high temperature-side extension part 36A and the low temperature-side extension part 37A. In addition, the element such as the thermoelectric conversion element 50 may not be provided between the high temperature-side extension part 36A and the low temperature-side extension part 37A. In this case, the controller 60, the battery 61, the inverter 62 and the external port 63 are also omitted. In this case, the loop-type heat pipe 30 has a function of cooling the heat-generating component 23. At this time, since the high temperature-side extension part 36A and the low temperature-side extension part 37A are provided, the heat generated in the heat-generating component 23 can also be radiated from the high temperature-side extension part 36A and the low temperature-side extension part 37A.

What is claimed is:

1. An electronic device comprising:
   a light-receiving device configured to receive solar light and comprising a heat storage material configured to receive the solar light;
   a loop-type heat pipe to which heat is input from the heat storage material of the light-receiving device and in which an operating fluid is enclosed in a loop-shaped flow path; and
   a thermoelectric conversion element configured to convert a temperature difference of the loop-type heat pipe into electric power,
   wherein the loop-type heat pipe has a loop structure having a loop shape,
   wherein the thermoelectric conversion element is arranged on an inner side of the loop structure,
   wherein the loop-type heat pipe has a high temperature-side extension part extending toward the inner side of the loop structure, and a low temperature-side extension part extending toward the inner side of the loop structure,
   wherein the high temperature-side extension part is in contact with a first surface of the thermoelectric conversion element,
   wherein the low temperature-side extension part is in contact with a second surface of the thermoelectric conversion element, the second surface of the thermoelectric conversion element being on an opposite side to the first surface of the thermoelectric conversion element,
   wherein the loop-type heat pipe has a first outer metal layer, a second outer metal layer, and an intermediate metal layer provided between the first outer metal layer and the second outer metal layer,
   wherein the high temperature-side extension part is formed by extending the first outer metal layer at a high-temperature part of the loop-type heat pipe,
   wherein the low temperature-side extension part is formed by extending the second outer metal layer at a low-temperature part of the loop-type heat pipe, and wherein the thermoelectric conversion element is positioned between the high temperature-side extension part and the low temperature-side extension part.

2. The electronic device according to claim 1, wherein the light-receiving device further comprises a collecting part configured to collect the solar light,
wherein the heat storage material is configured to receive the solar light via the collecting part.

3. The electronic device according to claim 1, further comprising:
a battery configured to be charged by the electric power generated in the thermoelectric conversion element; and
an external port configured to supply the electric power to an external device.

4. The electronic device according to claim 1, wherein the intermediate metal layer has a structure where a plurality of metal layers is stacked, and
wherein the high temperature-side extension part is formed by extending the first outer metal layer at the high-temperature part and some of the plurality of metal layers at the high-temperature part.

5. The electronic device according to claim 1, wherein the high temperature-side extension part has an expanded flow path formed by expanding the flow path at the high-temperature part of the loop-type heat pipe toward the inner side of the loop structure.

6. The electronic device according to claim 1, wherein an outer surface of the low temperature-side extension part has a plurality of concave portions.

7. The electronic device according to claim 1, wherein the thermoelectric conversion element is arranged on the inner side of the loop structure so that a length of the high temperature-side extension part is shorter than a length of the low temperature-side extension part.

8. The electronic device according to claim 1, wherein the loop-type heat pipe comprises:
an evaporator configured to vaporize the operating fluid by heat input from the light-receiving device,
a condenser configured to condense the operating fluid,
a liquid pipe configured to connect the evaporator and the condenser to each other, and
a vapor pipe configured to connect the evaporator and the condenser to each other,
wherein the high temperature-side extension part extends from the vapor pipe toward the inner side of the loop structure, and
wherein the low temperature-side extension part extends from the liquid pipe toward the inner side of the loop structure.

* * * * *